(12) United States Patent
Kim et al.

(10) Patent No.: US 12,308,259 B2
(45) Date of Patent: May 20, 2025

(54) METHOD FOR MANUFACTURING DISPLAY DEVICE AND APPARATUS FOR MANUFACTURING DISPLAY DEVICE

(71) Applicant: Samsung Display Co., LTD., Yongin-si (KR)

(72) Inventors: Dong Woo Kim, Seoul (KR); Jong Hoon Park, Asan-si (KR); Myung Gil Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 230 days.

(21) Appl. No.: 17/965,783

(22) Filed: Oct. 14, 2022

(65) Prior Publication Data

US 2023/0178391 A1 Jun. 8, 2023

(30) Foreign Application Priority Data

Dec. 8, 2021 (KR) .......................... 10-2021-0174485

(51) Int. Cl.
*H01L 21/67* (2006.01)
*H01L 21/68* (2006.01)
(Continued)

(52) U.S. Cl.
CPC .. *H01L 21/67092* (2013.01); *H01L 21/67259* (2013.01); *H01L 21/681* (2013.01); *H01L 23/544* (2013.01); *H01L 24/32* (2013.01); *H01L 24/75* (2013.01); *H01L 24/83* (2013.01); *H01L 25/18* (2013.01); *H01L 23/5387* (2013.01); *H01L 24/33* (2013.01); *H01L 2223/54426* (2013.01); *H01L 2224/32227* (2013.01);
(Continued)

(58) Field of Classification Search
None
See application file for complete search history.

(56) References Cited

U.S. PATENT DOCUMENTS

2013/0201639 A1* 8/2013 Ryu ..................... H05K 1/0269
156/64
2017/0257988 A1* 9/2017 Choi ..................... H05K 13/00

FOREIGN PATENT DOCUMENTS

KR 100853298 8/2008
KR 200461804 8/2012
(Continued)

OTHER PUBLICATIONS

Machine English translation of KR100853298, Accessed Sep. 16, 2024 (Year: 2008).*

*Primary Examiner* — Jacob T Minskey
*Assistant Examiner* — Adrianna N Konves
(74) *Attorney, Agent, or Firm* — CANTOR COLBURN LLP

(57) ABSTRACT

A method for manufacturing a display device includes preparing a display device including a display panel including a first alignment mark and a first circuit board including a second alignment mark and on one end of the display panel, disposing the display device on a stage including a base mark, setting the base mark as a reference mark in consideration of a relative position relation between the first alignment mark and the base mark by sensing the first alignment mark and the base mark, and determining a bending state of the display device by sensing the base mark and the second alignment mark and identifying a position relation between the base mark and the second alignment mark.

7 Claims, 17 Drawing Sheets

(51) Int. Cl.
*H01L 23/00* (2006.01)
*H01L 23/544* (2006.01)
*H01L 25/18* (2023.01)
*H01L 23/538* (2006.01)

(52) U.S. Cl.
CPC .............. *H01L 2224/33181* (2013.01); *H01L 2224/75704* (2013.01); *H01L 2224/75724* (2013.01); *H01L 2224/75753* (2013.01); *H01L 2224/75804* (2013.01); *H01L 2224/75821* (2013.01); *H01L 2224/8313* (2013.01); *H01L 2224/83132* (2013.01); *H01L 2224/83192* (2013.01); *H01L 2224/83201* (2013.01)

(56) References Cited

FOREIGN PATENT DOCUMENTS

| | | |
|---|---|---|
| KR | 1020150114407 | 10/2015 |
| KR | 1020170104102 | 9/2017 |
| KR | 1020200019473 | 2/2020 |

\* cited by examiner

METHOD FOR MANUFACTURING DISPLAY DEVICE AND APPARATUS FOR MANUFACTURING DISPLAY DEVICE

This application claims priority to Korean Patent Application No. 10-2021-0174485, filed on Dec. 8, 2021, and all the benefits accruing therefrom under 35 U.S.C. 119, the content of which in its entirety is herein incorporated by reference.

BACKGROUND

1. Field

Embodiments of the disclosure relate to a method and an apparatus, and more particularly, to a method for manufacturing a display device and an apparatus for manufacturing the display device.

2. Description of the Related Art

Mobile electronic devices have been widely used. Recently, a tablet personal computer ("PC") has been widely used as a mobile electronic device in addition to a small electronic device such as a mobile phone.

Such a mobile electronic device includes a display device to provide a user with visual information such as image or video, thereby supporting various functions. Recently, as other components for driving the display device are miniaturized, a proportion of the display device occupied in the electronic device is gradually increasing, and a structure that may be bent to have a predetermined angle at a flat state has been developed.

SUMMARY

Embodiments of the disclosure provide a method for manufacturing a display device, in which a panel mark is provided to overlap a circuit board in a process of bending the display device, thereby preventing the display device from being determined as having a defect.

Embodiments of the disclosure provide an apparatus for manufacturing a display device, in which a panel mark is provided to overlap a circuit board in a process of bending the display device, thereby preventing the display device from being determined as having a defect.

According to an embodiment of the disclosure, a method for manufacturing a display device includes preparing a display device including a display panel including a first alignment mark and a first circuit board including a second alignment mark and on one end of the display panel, disposing the display device on a stage including a base mark, setting the base mark as a reference mark in consideration of a relative position relation between the first alignment mark and the base mark by sensing the first alignment mark and the base mark, and determining a bending state of the display device by sensing the base mark and the second alignment mark and identifying a position relation between the base mark and the second alignment mark.

In an embodiment, the preparing a display device may include disposing the first circuit board including the second alignment mark on one end of the display panel including the first alignment mark, determining an alignment state of the first circuit board and the display panel by identifying the position relation of the first alignment mark and the second alignment mark, and attaching the first circuit board to the one end of the display panel.

In an embodiment, the determining the bending state of the display device may include primarily aligning the display device by adjusting a relative position and angle of the display device and a bending unit by using position data of the base mark and the second alignment mark before bending of the display device.

In an embodiment, the determining the bending state of the display device may include performing the bending of the display device by allowing the bending unit to bend the first circuit board.

In an embodiment, the determining the bending state of the display device may further include secondarily aligning the display device by adjusting a relative position of the display panel and the first circuit board which is bent, by using position data of the base mark and the second alignment mark after the bending of the display device.

In an embodiment, the determining the bending state of the display device may further include determining whether a difference between the position data of the base mark and the second alignment mark and set data is less than or equal to a reference value by comparing the position data of the base mark and the second alignment mark with the set data after the bending of the display device.

In an embodiment, the determining the bending state of the display device may further include allowing the banding unit to pressurize the first circuit board, on an end of which an adhesive is disposed on, toward the display panel to attach a surface of the one end of the display panel to the first circuit board.

According to an embodiment of the disclosure, a method for manufacturing a display device includes preparing a display device including a display panel including a first alignment mark and a first circuit board including a second alignment mark and on one end of the display panel, disposing the display device on a stage, setting a same point as the first alignment mark on a photographing range of a position sensing unit, which photographs the display device and the stage, to a base mark, setting the base mark as a reference mark in consideration of a relative position relation between the first alignment mark and the base mark by sensing the first alignment mark, and determining a bending state of the display device by sensing the base mark and the second alignment mark and identifying a position relation between the base mark and the second alignment mark.

In an embodiment, the preparing the display device may include determining an alignment state of the first circuit board and the display panel by disposing the first circuit board including the second alignment mark on one end of the display panel including the first alignment mark and identifying a position relation between the first alignment mark and the second alignment mark, and attaching the first circuit board to the one end of the display panel.

In an embodiment, the determining the bending state of the display device may include primarily aligning the display device by adjusting a relative position and angle of the display device and a bending unit by using position data of the base mark and the second alignment mark before bending of the display device.

In an embodiment, the determining the bending state of the display device may further include performing the bending of the display device by allowing the bending unit to bend the first circuit board, secondarily aligning the display device by adjusting a relative position of the display panel and the first circuit board which is bent, by using the position data of the base mark and the second alignment mark after the bending of the display device, and determining whether a difference between the position data of the base mark and the second alignment mark and set data is less than or equal to a reference value by comparing the position data of the base mark and the second alignment mark with the set data after the bending of the display device.

According to an embodiment of the disclosure, a method for manufacturing a display device includes preparing a display device including a display panel including a first alignment mark and a first circuit board including a second alignment mark and on one end of the display panel, disposing the display device on a stage, setting a photographing range of a position sensing unit to sense all edges on the other surface of the display panel and setting a same point as a vertex of the other surface of the display panel on the photographing range of the position sensing unit, to a base mark, setting the base mark as a reference mark in consideration of a relative position relation between the first alignment mark and the base mark by sensing the first alignment mark, and determining a bending state of the display device by sensing the base mark and the second alignment mark and identifying a position relation between the base mark and the second alignment mark.

In an embodiment, the preparing the display device may include determining an alignment state of the first circuit board and the display panel by disposing the first circuit board including the second alignment mark on one end of the display panel including the first alignment mark and identifying a position relation between the first alignment mark and the second alignment mark, and attaching the first circuit board to the one end of the display panel.

In an embodiment, the determining the bending state of the display device may include primarily aligning the display device by adjusting a relative position and angle of the display device and a bending unit by using position data of the base mark and the second alignment mark before bending of the display device.

In an embodiment, the determining the bending state of the display device may further include performing the bending of the display device by allowing the bending unit to bend the first circuit board, secondarily aligning the display device by adjusting a relative position of the display panel and the first circuit board which is bent, by using the position data of the base mark and the second alignment mark after bending of the display device, and determining w whether a difference between the position data of the base mark and the second alignment mark and set data is less than or equal to a reference value by comparing the position data of the base mark and the second alignment mark with the set data after bending of the display device.

According to an embodiment of the disclosure, an apparatus for manufacturing a display device includes a stage including a base mark, where a display device including a first alignment mark and a second alignment mark is disposed on the stage, a stage driving unit which drives a movement of the stage, a bending unit which bends the display device disposed on the stage, a position sensing unit disposed on an upper portion of the stage, where the position sensing unit senses positions of the first alignment mark, the second alignment mark and the base mark, and a controller which determines whether an alignment state of the display device, based on position data sensed by the position sensing unit, where the position data includes first position data between the first alignment mark and the base mark and second position data between the second alignment mark and the base mark, the controller includes a memory including first reference data and second reference data, and a comparator which determines an alignment state of the display device for the bending unit by comparing the first position data with the first reference data and determining a bending match of the display device which is bent, by comparing the second position data with the second reference data.

In an embodiment, when the alignment state of the display device is outside a reference range, the comparator may generate error data corresponding to a difference between the alignment states and the reference range, and may provide the error data to the stage driving unit, and the stage driving unit may drive the movement of the stage based on the error data in a way such that the alignment state of the display device and the bending unit is within the reference range based on the error data.

In an embodiment, the movement of the stage may include a rotational movement.

In an embodiment, the position sensing unit may include a photographing unit which photographs the stage and the display device disposed on the stage.

In an embodiment, the position sensing unit may further include an image analyzing unit which analyzes image data acquired by the photographing unit to generate the first position data or the second position data.

In embodiments of the method for manufacturing a display device and the apparatus for manufacturing a display device according to the disclosure, an alignment state of the display device may be determined without using a panel mark disposed on a display panel. Therefore, a defect caused when the alignment state of the display device is determined using the panel mark may be avoided. In such embodiments, cases where the display devices discarded when the panel mark is not visible may be reduced, such that process efficiency of the display device may be improved.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
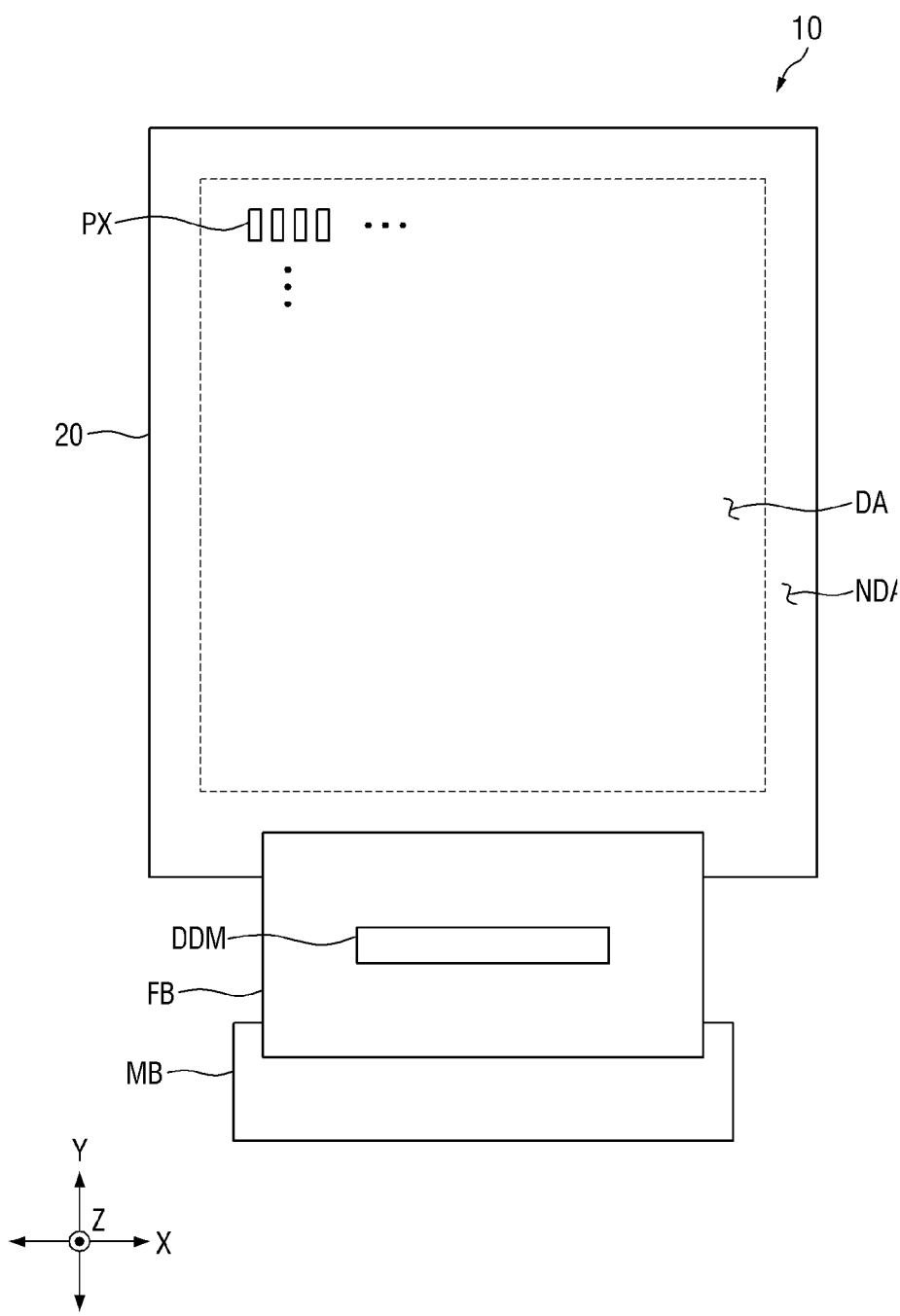
FIG. 1 is a plan view illustrating a display device when a first circuit board is unfolded.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be. In contrast, when an element is referred to as being "directly on" another element, there are no intervening elements present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
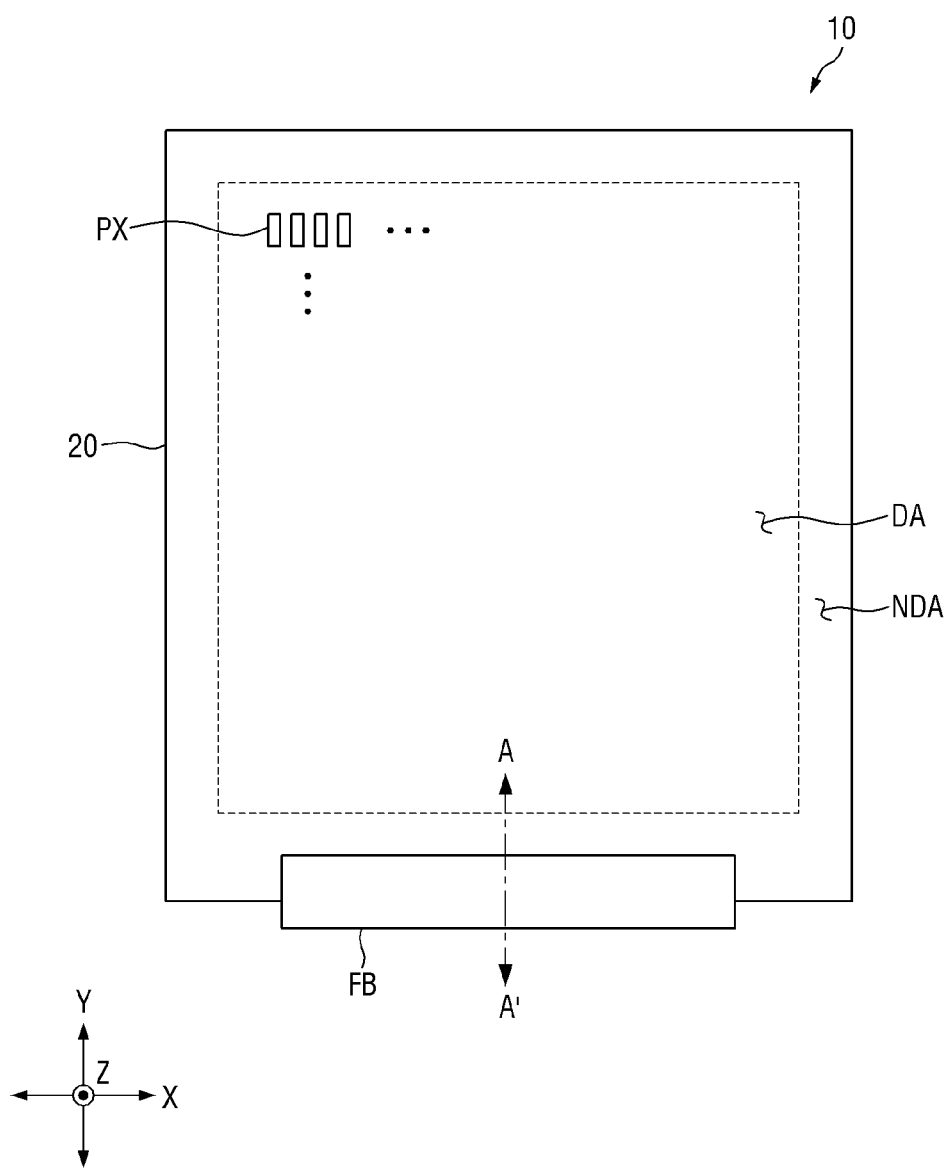
FIG. 2 is a plan view illustrating a display device when a first circuit board is bent.

FIG. 1 is a plan view illustrating a display device when a first circuit board is unfolded. FIG. 2 is a plan view illustrating a display device when a first circuit board is bent.

Referring to FIGS. 1 and 2, a display device 10 is a device that displays a moving image or a still image. The display device 10 may be used as a display screen of various electronic products such as a television, a laptop computer, a monitor, a billboard and a device for Internet of things ("IoT") as well as portable electronic devices such as a mobile phone, a smart phone, a tablet personal computer ("PC"), a smart watch, a watch phone, a mobile communication terminal, an electronic notebook, an electronic book, a portable multimedia player ("PMP"), a navigation device and an ultra mobile PC ("UMPC").

In an embodiment, the display device 10 may have a substantially rectangular shape having both short sides in a first direction X and both long sides in a second direction Y on a plane, but is not limited thereto. Alternatively, the display device 10 may have various planar shapes such as a polygonal shape, a circular shape and an oval shape.

In an embodiment, the display device 10 may include a display panel 20, a first circuit board FB and a second circuit board MB.

The display panel 20 may include a light emitting element. In an embodiment, for example, the display panel 20 may be an organic light emitting display panel 20 using an organic light emitting diode ("LED") including an organic light emitting layer, a micro light emitting display panel 20 using a micro LED, a quantum dot light emitting display panel 20 using a quantum dot LED including a quantum dot light emitting layer, or an inorganic light emitting display panel 20 using an inorganic LED including an inorganic semiconductor. In an embodiment, the display panel 20 may be an organic light emitting display panel 20, but is not limited thereto.

The display panel 20 may include a display area DA and a non-display area NDA.

The display area DA may display an image. A plurality of pixels PX for displaying an image may be disposed in the display area DA. The display area DA may sense an input for recognizing a touch input, a fingerprint pattern and a pen input of a user. The display area DA may include a plurality of sensors for sensing a touch input, a fingerprint pattern and a pen input. In an embodiment, the display area DA may have, for example, a rectangular plane shape, but is not limited thereto.

The non-display area NDA may be disposed near the display area DA. The non-display area NDA may be disposed to surround at least a portion of the display area DA on a plane. The non-display area NDA may not display an image. The non-display area NDA may not sense a touch input, a fingerprint pattern and pen inputs of a user. A signal line connected to the pixel PX may be disposed in the non-display area NDA. The non-display area NDA may refer to the remaining area except for the display area DA of the display device 10.

The first circuit board FB may be attached to a pad area (PA of FIG. 4) that is defined by one end portion of the display panel 20. The first circuit board FB may have flexibility to be bent. Therefore, the first circuit board FB may be bent toward a rear surface of the display device 10. The first circuit board FB may be a flexible circuit film, but is not limited thereto. In an alternative embodiment, for example, the first circuit board FB may be a flexible plastic.

In an embodiment, a driving chip DDM may be disposed or packaged on the first circuit board FB. The driving chip DDM may process an electrical signal output from the display panel 20 to provide the processed electrical signal to the second circuit board MB. The driving chip DDM may include at least one integrated circuit, for example, a display driving integrated circuit. in an embodiment, the driving chip DDM may be a display driving chip DDM that provides an electrical signal for driving the plurality of pixels PX to the display panel 20, but is not limited thereto. In an embodiment, the driving chip DDM may be a touch driving chip DDM that includes a touch driving integrated circuit for recognizing a touch input, a fingerprint pattern and a pen input of a user.

The second circuit board MB may be attached to an end portion of the first circuit board FB. The second circuit board MB may be electrically connected to the display panel 20 by the first circuit board FB. The second circuit board MB may provide image data, a control signal, a power supply voltage, etc. to the display panel 20 or a driving circuit. In an embodiment, for example, the second circuit board MB may be a rigid printed circuit board.

Figure 3:
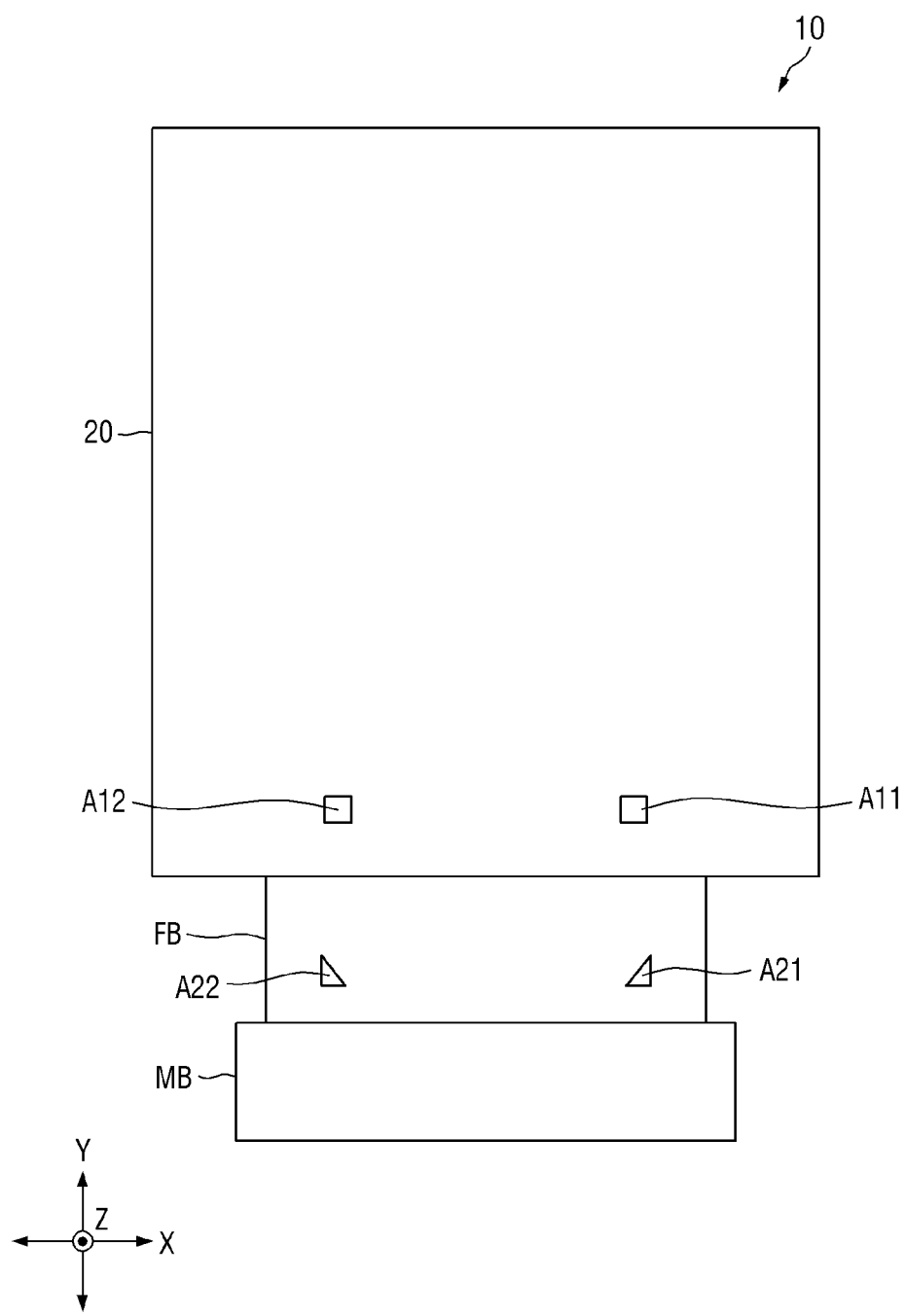
FIG. 3 is a rear view illustrating a display device when the first circuit board is unfolded.

FIG. 3 is a rear view illustrating a display device when the first circuit board is unfolded.

Referring to FIG. 3, marks may be provided or imprinted on a rear surface of the display device 10. In an embodiment, marks imprinted on the display panel 20 are defined as panel marks A11 and A12, and marks imprinted on the first circuit board FB are defined as process marks A21 and A22. In such an embodiment, a panel mark disposed on a right side of the drawing among the panel marks A11 and A12 are defined as the first panel mark A11, a panel mark disposed on a left side among the panel marks A11 and A12 are defined as the second panel mark A12, a process mark disposed on the right side among the process marks A21 and A22 are defined as the first process mark A21, and a process mark disposed on the left side among the process marks A21 and A22 are defined as the second process mark A22. Each of the marks may serve to determine the alignment of the display device 10, as will be described later with reference to FIGS. 10 to 15.

Figure 4:
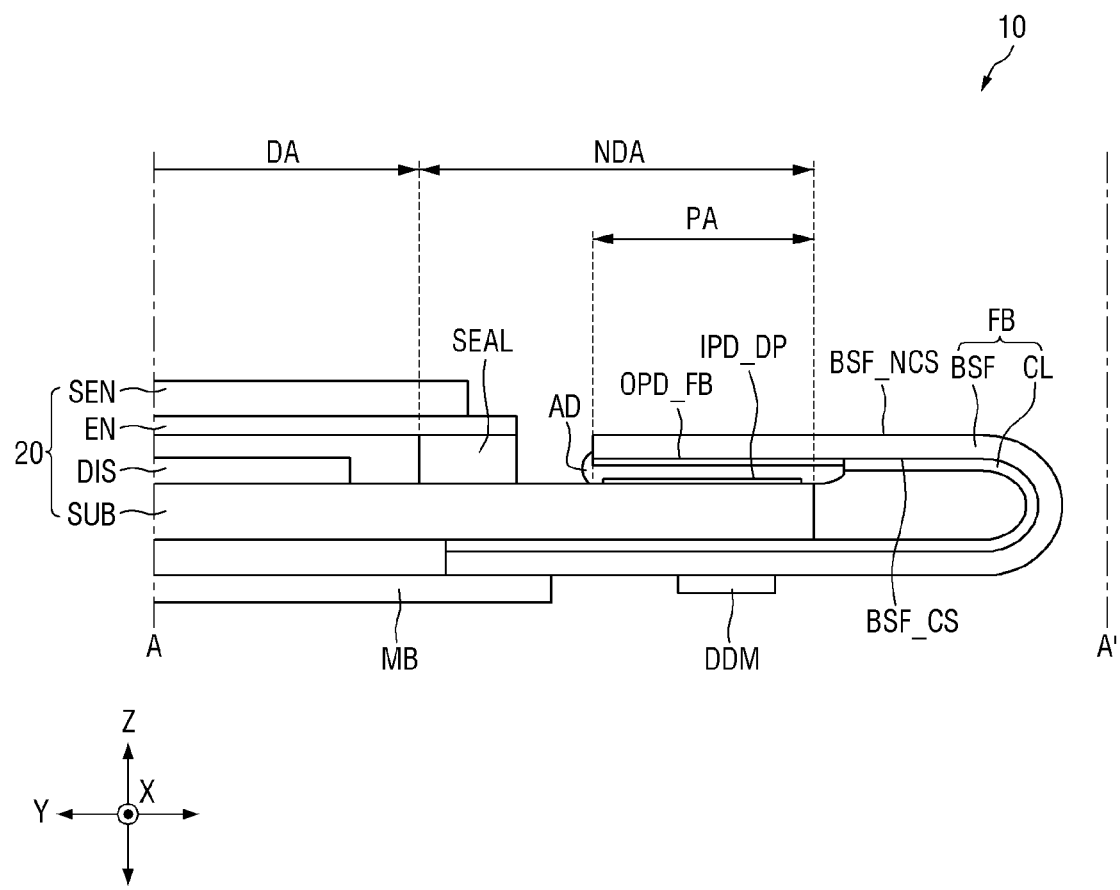
FIG. 4 is a cross-sectional view taken along line A-A' of FIG. 2.

FIG. 4 is a cross-sectional view taken along line A-A' of FIG. 2.

Referring to FIG. 4, in an embodiment, the display panel 20 may include a first substrate SUB, a display unit DIS, a sealant SEAL, a second substrate EN and a sensor electrode layer SEN.

The first substrate SUB may be disposed over the display area DA and the non-display area NDA. The first substrate SUB may include or be formed of a polymer material that includes glass or plastic. In an embodiment, the first substrate SUB may be transparent, but is not limited thereto.

The display unit DIS is disposed on one surface of the first substrate SUB, and serves to display an image. The display unit DIS may be any one of a front display type for providing light related to an image toward the second substrate EN, a rear display type for providing light related to the image toward a rear surface of the first substrate SUB, and a double-sided display type for providing light related to the image toward both front and rear surfaces. The display unit DIS may include light emitting elements and a thin film transistor for driving the light emitting elements.

The sealant SEAL may be disposed in the non-display area NDA inside the display device 10 to form a planar closed curve and surround the display area DA of the display panel 20. The sealant SEAL may surround the light emitting elements disposed in the display area DA, and may be disposed in a closed curve along an outer portion of the second substrate EN between the first substrate SUB and the second substrate EN to bond the first substrate SUB and the second substrate EN to each other. In an embodiment, the sealant SEAL may include an epoxy adhesive having an adhesive property, an ultraviolet curing adhesive, a frit or the like, but this is not limited thereto.

The second substrate EN is disposed to face the first substrate SUB. The second substrate EN may be an encapsulation substrate. The second substrate EN may include, but is not limited to, transparent glass or the like. In an embodiment, for example, a transparent plastic may be used as the second substrate EN.

The sensor electrode layer SEN may be disposed on one surface of the second substrate EN. The sensor electrode layer SEN senses a change amount in mutual capacitance formed between sensor patterns (not shown) that include the sensor electrode layer SEN to recognize a touch of a user.

In an embodiment, the display panel 20 may be a rigid panel that includes a first substrate SUB and a second substrate EN and a sealant SEAL, but the display panel 20 is not limited thereto. In an alternative embodiment, for example, the display panel 20 may be a flexible panel that includes a flexible substrate including a flexible material such as polyimide and an encapsulation film. Hereinafter, for convenience of description, embodiments where the display panel 20 is a rigid panel will be described.

The display device 10 may further include a pad area PA disposed in the non-display area NDA and a panel pad IPD_DP disposed in the pad area PA.

The pad area PA may be disposed in the non-display area NDA. The pad area PA may overlap the first circuit board FB in a third direction Z. Here the third direction Z may be a thickness direction of the display device 10 or the first substrate SUB. The pad area PA may be an area to which the first circuit board FB is attached to overlap the first substrate SUB of the display panel 20. In an embodiment, for example, the pad area PA may be disposed along one short side extended in the first direction X of the display panel 20, but is not limited thereto.

The first circuit board FB may be spaced apart from the sealant SEAL in the second direction Y and disposed on one surface of the first substrate SUB.

The panel pad IPD_DP may be disposed on one surface of the first substrate SUB facing the first circuit board FB. The panel pad IPD_DP may be disposed to overlap an output pad OPD_FB in the third direction Z.

The first circuit board FB may include a base film BSF, a coating layer CL and an output pad OPD_FB.

The base film BSF may have flexibility to be bent. In the pad area PA, the first substrate SUB and the base film BSF of the display panel 20 may overlap each other in the third direction Z.

The base film BSF may include a first surface BSF_CS that partially faces the pad area PA of the display panel 20, and a second surface BSF_NCS that is an opposite surface of the first surface BSF_CS. The first surface BSF_CS may be referred to as a coupling surface, and the second surface BSF_NCS may be referred to as a non-coupling surface.

The output pad OPD_FB may be disposed on the first surface BSF_CS while facing the panel pad IPD_DP. As will be described later, the output pad OPD_FB may be provided in plural. The driving chip DDM may be disposed or packaged on the second surface BSF_NCS, but is not limited thereto. The driving chip DDM may be disposed or packaged on the first surface BSF_CS.

The coating layer CL may be disposed on the base film BSF. The coating layer CL may be disposed on the first surface BSF_CS. The coating layer CL may be electrically insulated by covering a wiring disposed on the base film BSF and connected to the output pad OPD_FB. In an embodiment, the coating layer CL may include, but is not limited to, an insulating material such as a solder resist.

The coating layer CL may be disposed to cover only a portion of the first surface BSF_CS. The portion of the first surface BSF_CS overlapping the display panel 20 and the output pad OPD_FB disposed on the portion of the first surface BSF_CS may be exposed toward the pad area PA of the display panel 20 without being covered by the coating layer CL.

The display device 10 may further include a conductive adhesive member AD for coupling the display panel 20 with the first circuit board FB.

The conductive adhesive member AD may be interposed between the pad area PA and the first circuit board FB to couple the pad area PA with the first circuit board FB. The conductive adhesive member AD may have electrical conductivity, and may have an adhesive force. The conductive adhesive member AD may attach the first circuit board FB to the display panel 20 and the second circuit board MB and electrically connect the first circuit board FB with the display panel 20 and the second circuit board MB. In an embodiment, for example, the conductive adhesive member AD may be an anisotropic conductive film, but is not limited thereto.

The first circuit board FB described above may be connected to a driving unit and bent from one surface of the display panel 20 to the other surface of the display panel 20, but is not limited thereto. In an embodiment, for example, the first circuit board FB may be connected to the sensor electrode layer SEN disposed on the second substrate EN to transmit a touch signal, and may be bent toward an opposing surface of the display panel 20.

In an embodiment, a proportion of the non-display area NDA occupied in the display device 10 may be reduced through a structure in which the first circuit board FB coupled to one surface of the display panel 20 of the display device 10 is bent toward an opposing surface of the display panel 20. In such an embodiment, if the display device 10 is not properly aligned in the process of bending the first circuit board FB, a bending direction may be distorted and excessive stress may be applied to a specific area. Therefore, it is desired to determine whether alignment of the display device 10 is properly performed during bending of the display device 10. Hereinafter, an algorithm or method for determining alignment of the display device 10 will be described together with an apparatus for manufacturing the display device 10.

Figure 5:
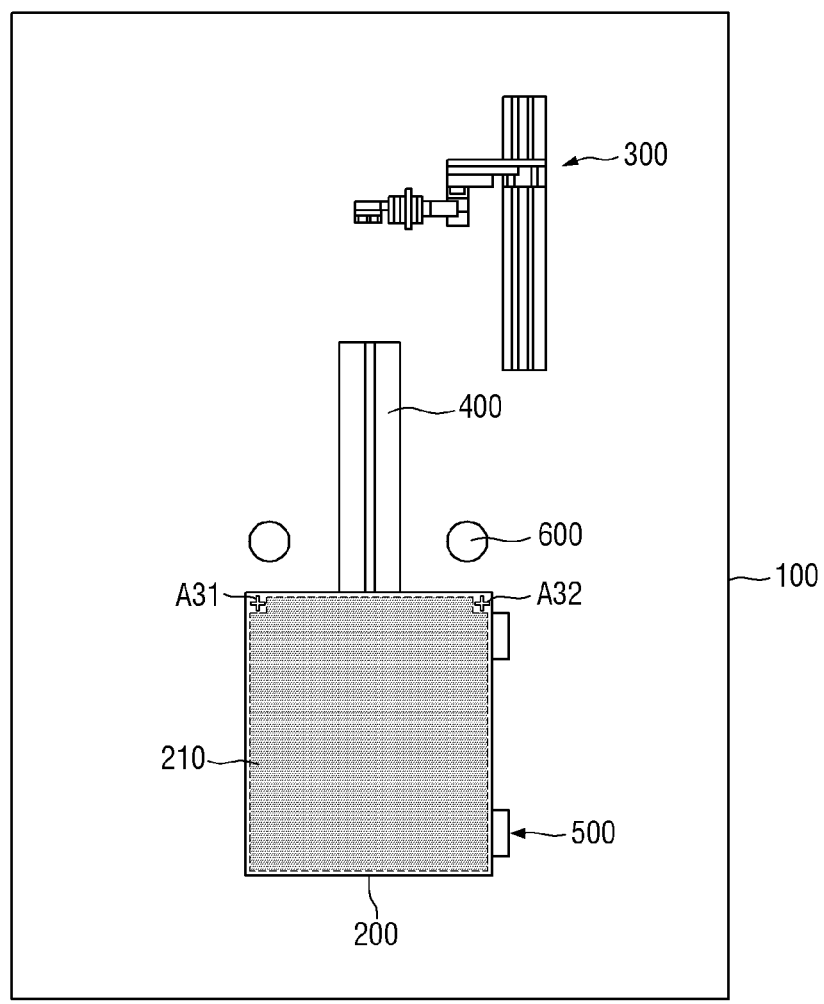
FIG. 5 is a plan view illustrating an apparatus for manufacturing a display device according to an embodiment of the disclosure.
Figure 6:
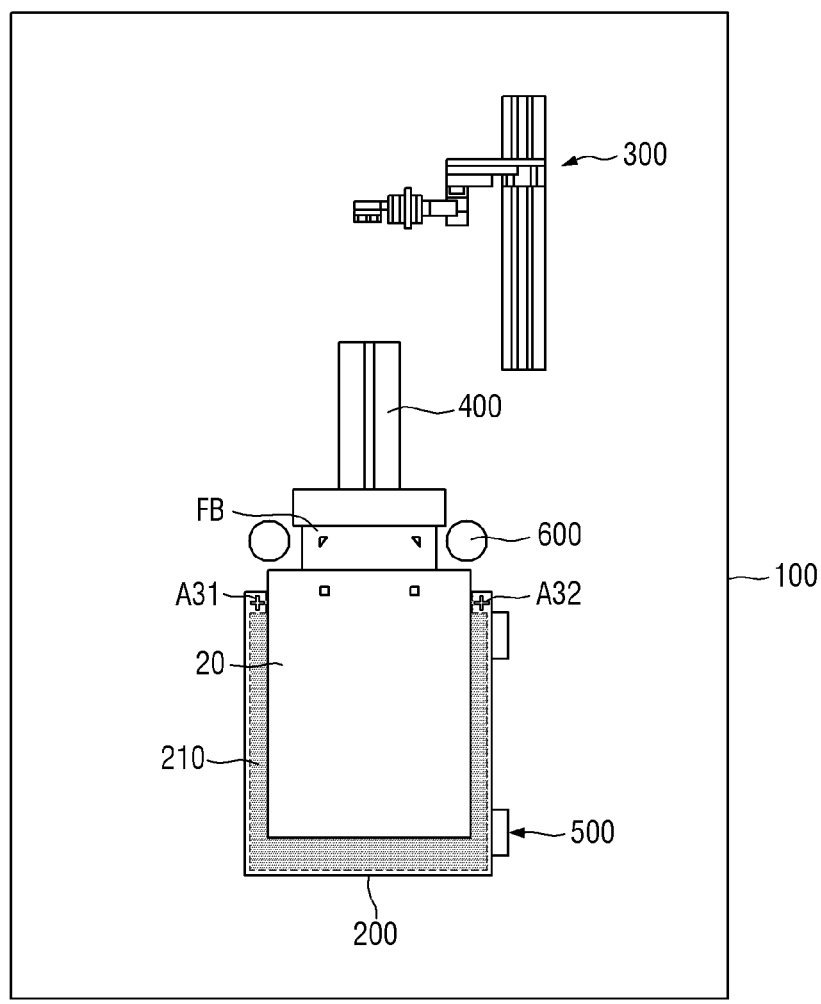
FIG. 6 is a plan view illustrating an apparatus for manufacturing a display device on which a display device is seated in accordance with an embodiment of the disclosure.
Figure 7:
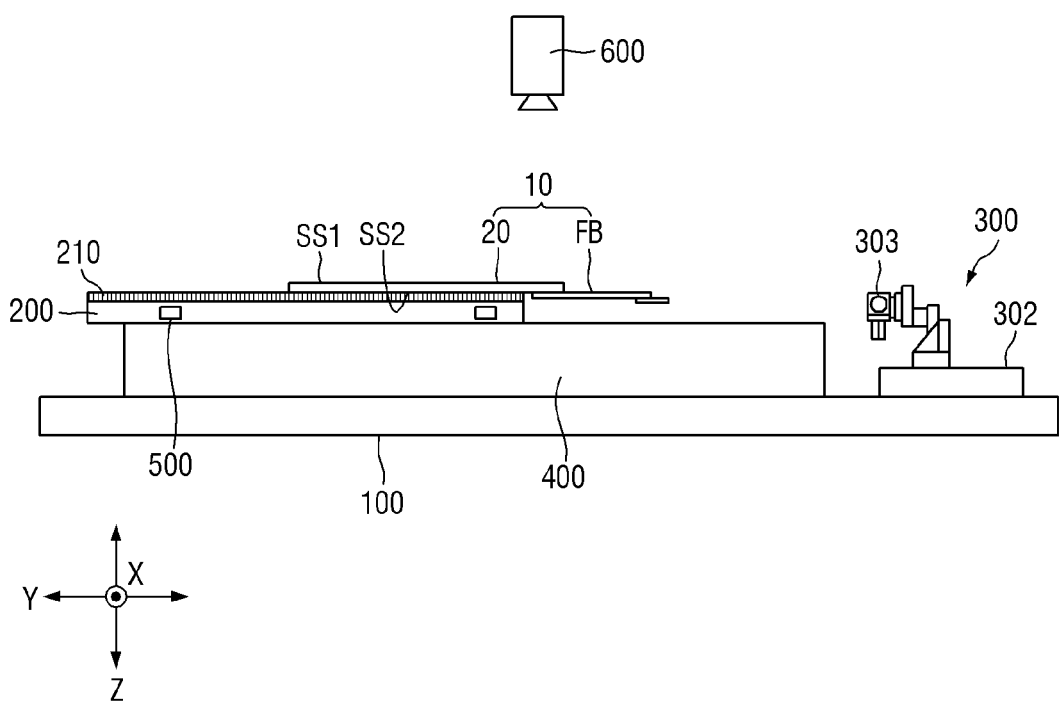
FIG. 7 is a front view illustrating an apparatus for manufacturing the display device shown in FIG. 6.

FIG. 5 is a plan view illustrating an apparatus for manufacturing a display device according to an embodiment of the disclosure. FIG. 6 is a plan view illustrating an apparatus for manufacturing a display device on which a display device is seated in accordance with an embodiment of the disclosure. FIG. 7 is a front view illustrating an apparatus for manufacturing the display device shown in FIG. 6.

Referring to FIGS. 5 to 7, an embodiment of the apparatus for manufacturing the display device 10 may include a base member 100, a stage 200, a device driving unit 300, a first driving unit 400, a controller 500 and a position sensing unit 600.

The first driving unit 400 is disposed on the base member 100, the stage 200 is disposed on the first driving unit 400, and the display device 10 may be seated on a seating portion 210 of the stage 200.

The display device 10 may have a first surface SS1 and a second surface SS2. One of the first surface SS1 and the second surface SS2 of the display device 10 may be a display surface. Also, the other one of the first surface SS1 and the second surface SS2 of the display device 10 may be a rear surface of the display surface. Hereinafter, for convenience of description, a case where the second surface SS2 of the display panel 20 is a display surface will be described in detail.

The second surface SS2 may be a surface facing the stage 200, and the first surface SS1 may be a surface positioned in an opposite direction of the second surface SS2 of the surface of the display device 10. When the display device 10 is seated on the stage 200, the second surface SS2, which is a display surface, may be seated to be in contact with the stage 200. A portion of the second surface SS2 may be seated on the stage 200, and a portion of the second surface SS2 may be protruded from the stage 200. In an embodiment, for example, the second surface SS2 of the display panel 20 may be seated on the stage 200, and the second surface SS2 of the display panel 20 may be disposed to be protruded from the stage 200, but the disclosure is not limited thereto.

The stage 200 may have a plate shape.

The stage 200 may include a pair of base marks A31 and A32. The base marks A31 and A32 may be disposed to be adjacent to two corners, which are disposed to be adjacent to the device driving unit 300, among four corners of the stage 200. The base marks A31 and A32 may be imprinted using a photoresist process, but are not limited thereto. In an embodiment, for example, the base marks A31 and A32 may be disposed in such a manner that stickers are attached using an adhesive. In an embodiment, as shown in FIG. 5, the pair of base masks A31 and A32 are defined in such a manner that the base mark disposed on a left side is defined as the first base mark A31 and the base mark disposed on a right side is defined as the second base mark A32.

The stage 200 may include a seating portion 210 for fixing the display device 10 after the display device 10 is seated. The seating portion 210 may be disposed in a remaining area except for the portions in which the base marks A31 and A32 are disposed. The seating portion 210 may be disposed to be different from the base marks A31 and A32, such that the base marks A31 and A32 may be prevented from being covered and invisible by the display device 10 seated on the seating portion 210.

The seating portion 210 may be provided in various shapes. In an embodiment, for example, the seating portion 210 may include an electrostatic chuck or an adhesive chuck, which is provided in the stage 200, or may include a clamp or jig shape, or may include a flow path and a pump connected to the flow path.

The stage 200 may be provided to be linearly movable on the base member 100 by the first driving unit 400. In an embodiment, for example, the stage 200 may be provided to linearly move in the second direction Y.

The device driving unit 300 may be provided to be linearly movable on the base member 100. In an embodiment, for example, the device driving unit 300 may be provided to linearly move in the second direction Y. In an embodiment, as described above, both the stage 200 and the bending unit 303 may be linearly moving, but not being limited thereto. In an alternative embodiment, for example, the stage 200 may be fixed and only the bending unit 303 may linearly move, or the bending unit 303 may be fixed and only the stage 200 may linearly move.

A bending unit 303 (shown in FIG. 7) of the device driving unit 300 may bend a portion of the display device 10.

The bending unit 303 may move the first circuit board FB of the display device 10 disposed on the stage 200 to a predetermined bending path and bend the first circuit board FB in the third direction Z, but is not limited thereto. In an embodiment, for example, where a flexible first substrate SUB is used in the display panel 20, the bending unit 303 may bend the display panel 20 rather than the first circuit board FB, and may bend the display panel 20 in other directions other than the third direction Z.

In some embodiments, the bending unit 303 may attach the first circuit board FB to one surface of the display device 10. The bending unit 303 may pressurize the first circuit board FB of the bent state in a vertical direction to attach the first circuit board FB onto one surface of the display device 10.

The first driving unit 400 may be provided to be connected to the stage 200. The first driving unit 400 may reciprocate the stage 200 in the second direction Y. In some embodiments, the first driving unit 400 may include a ball screw connected to the stage 200 and a motor connected to the ball screw. In an embodiment, the first driving unit 400 may rotationally move the stage 200.

A second driving unit 302 (shown in FIG. 7) of the device driving unit 300 may be provided to be connected to the stage 200 on a side of the stage 200. The second driving unit 302 may vary a position of the bending unit 303 on the stage 200. In an embodiment, for example, the second driving unit 302 may move the bending unit 303 on the stage 200 in at least one of the first direction X or the second direction Y. In addition, the second driving unit 302 may rotate the bending unit 303 on the plane defined by the first direction X and the second direction Y. The second driving unit 302 may serve to adjust a relative position and angle between the display device 10 disposed on the stage 200 and the bending unit 303. In such an embodiment, the second driving unit 302 may adjust position of the bending unit 303 on the stage 200 by moving and/or rotating the bending unit 303 so that a portion to be bent in the display device 10 disposed on the stage 200 is disposed to be adjacent to the bending unit 303. The second driving unit 302 may include, or be in the form of, a motor, a cylinder, etc. provided near the stage 200.

A pair of position sensing units 600 may be disposed on the stage 200. The position sensing unit 600 disposed on a left side may sense the first panel mark A11, the first process mark A21 and the first base mark A31, which are disposed on the left side, and the position sensing unit 600 disposed on a right side may sense the second panel mark A12, the second process mark A22 and the second base mark A32, which are disposed on the right side. When the stage 200 moves, the position sensing unit 600 may adjust a relative position with the stage 200 and move together with the stage 200 in the same direction. Therefore, even when the stage 200 moves, the position sensing unit 600 may sense the base marks A31 and A32 provided in the stage 200 and the panel marks A11 and A12 and the process marks A21 and A22 of the display device 10 disposed on the seating portion 210 of the stage 200 while moving together with the stage 200. In an embodiment, for example, when the stage 200 is fixed and only the bending unit 303 moves, the position sensing unit 600 may also be fixed without moving. The position sensing unit 600 may include, or be in the form of, a vision camera, and may photograph the display device 10 on the stage 200 to transmit the photographed image to the outside.

Figure 8:
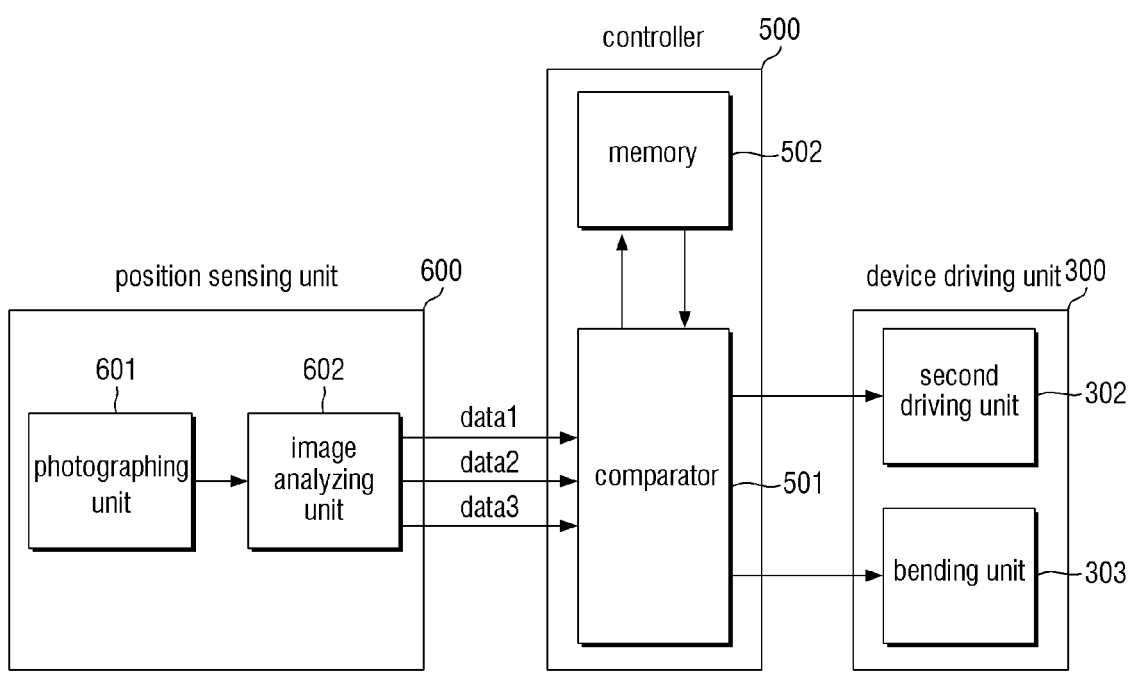
FIG. 8 is a block diagram illustrating an apparatus for manufacturing a display device according to an embodiment of the disclosure.

FIG. 8 is a block diagram illustrating an apparatus for manufacturing a display device according to an embodiment of the disclosure.

Referring to FIG. 8, the position sensing unit 600 may include a photographing unit 601 and an image analyzing unit 602. The photographing unit 601 may transmit an image obtained by photographing the display device 10, which is seated on the stage 200, to the analyzing unit. The image analyzing unit 602 may receive the image from the photographing unit 601 and generate position data data1 of the panel marks A11 and A12, position data data2 of the process marks A21 and A22 and position data data3 of the base marks A31 and A32 based on the image, and transmit the generated position data to the controller 500.

The controller 500 may include a memory 502 and a comparator 501. The comparator 501 may receive the position data data1 of the panel marks A11 and A12, the position data data2 of the process marks A21 and A22 and the position data data3 of the base marks A31 and A32 from the image analyzing unit 602. The comparator 501 may transmit the position data data1 of the panel marks A11 and A12 and the position data data3 of the base marks A31 and A32 among the received data to the memory 502. The memory 502 may search for data corresponding to the position data data1 of the panel marks A11 and A12 and the position data data3 of the base marks A31 and A32, which are received from a stored lookup table, and may transmit the searched data to the comparator 501. In an embodiment, the data transmitted by the memory 502 may be a pair of position data of each of the ideal process marks A21 and A22 and the ideal base marks A31 and A32 before/after bending of the display device 10. The comparator 501 may drive the driving unit by comparing the position data data2 of the process marks A21 and A22 and the position data data3 of the base marks A31 and A32, which are received from the image analyzing unit 602, with the position data of the ideal process marks A21 and A22 and the position data of the ideal base marks A31 and A32, which are received from the memory 502.

The device driving unit 300 may include the second driving unit 302 and the bending unit 303.

A detailed operation of each element of the apparatus for manufacturing a display device will be described together with a method for manufacturing the display device 10.

Figure 9:
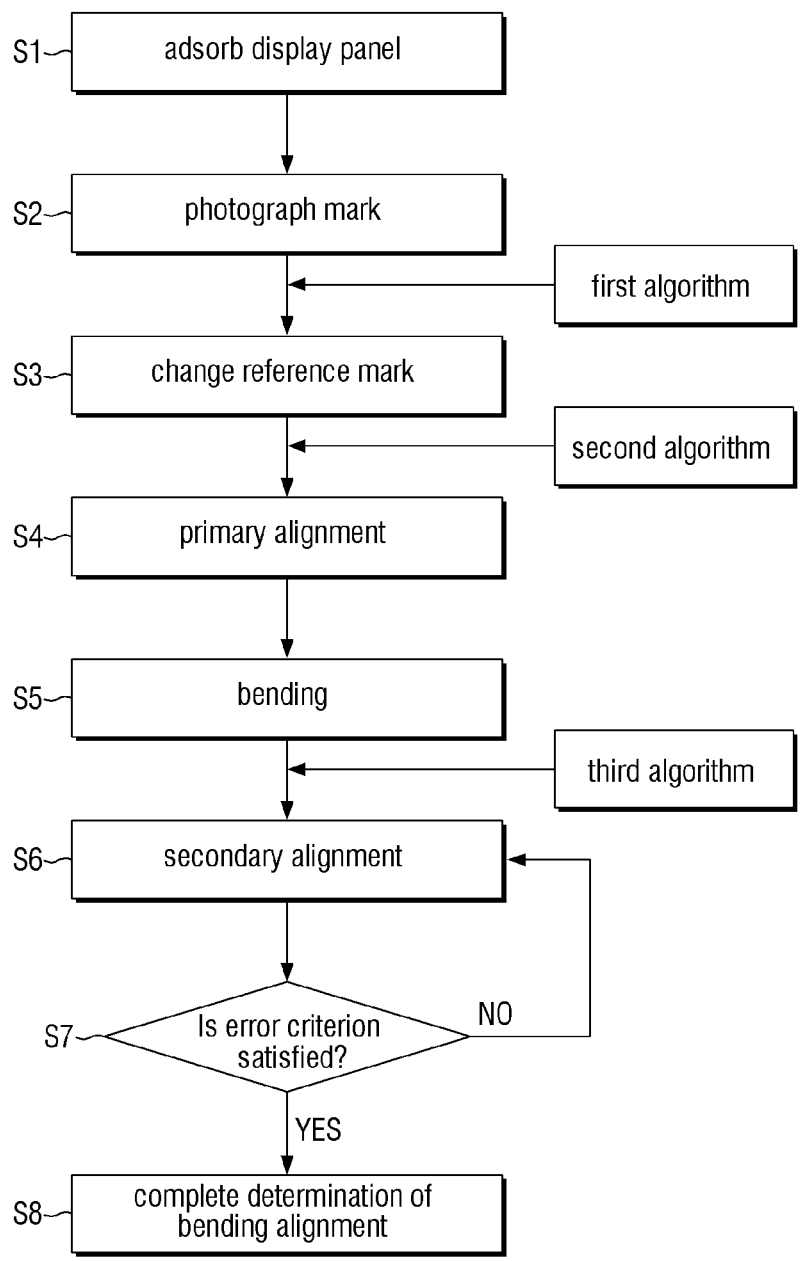
FIG. 9 is a flow chart illustrating a method for manufacturing a display device.

FIG. 9 is a flow chart illustrating a method for manufacturing a display device.

Referring to FIG. 9, an embodiment of the method for manufacturing the display device 10 may include a process S1 of adsorbing the display panel 20, a process S2 of photographing a mark, a process S3 of changing a reference mark, a process S4 of primarily aligning the display device 10, a process S5 of bending the display device 10, a process S6 of secondarily aligning the display device 10, a process S7 of determining whether an error criterion is satisfied, and a process S8 of completing determination of bending arrangement.

FIGS. 10 to 15 are plan views and cross-sectional views illustrating a method for of manufacturing a display device according to an embodiment.

Hereinafter, an embodiment of the method for manufacturing the display device 10 will be described in more detail together with the flow chart of FIG. 9 and the drawings shown in FIGS. 10 to 15.

In an embodiment, the method for manufacturing the display device 10 includes determining alignment during bending of the display device 10 (or an alignment state of the display device 10). The process of determining alignment during bending of the display device 10 includes a process S1 of adsorbing the display panel 20, a process S2 of photographing a mark, a process S3 of changing a reference mark, a process S4 of primarily aligning the display device 10, a process S5 of bending the display device 10, a process S6 of secondarily aligning the display device 10, a process S7 of determining whether an error criterion is satisfied, and a process S8 of completing determination of bending arrangement.

Figure 10:
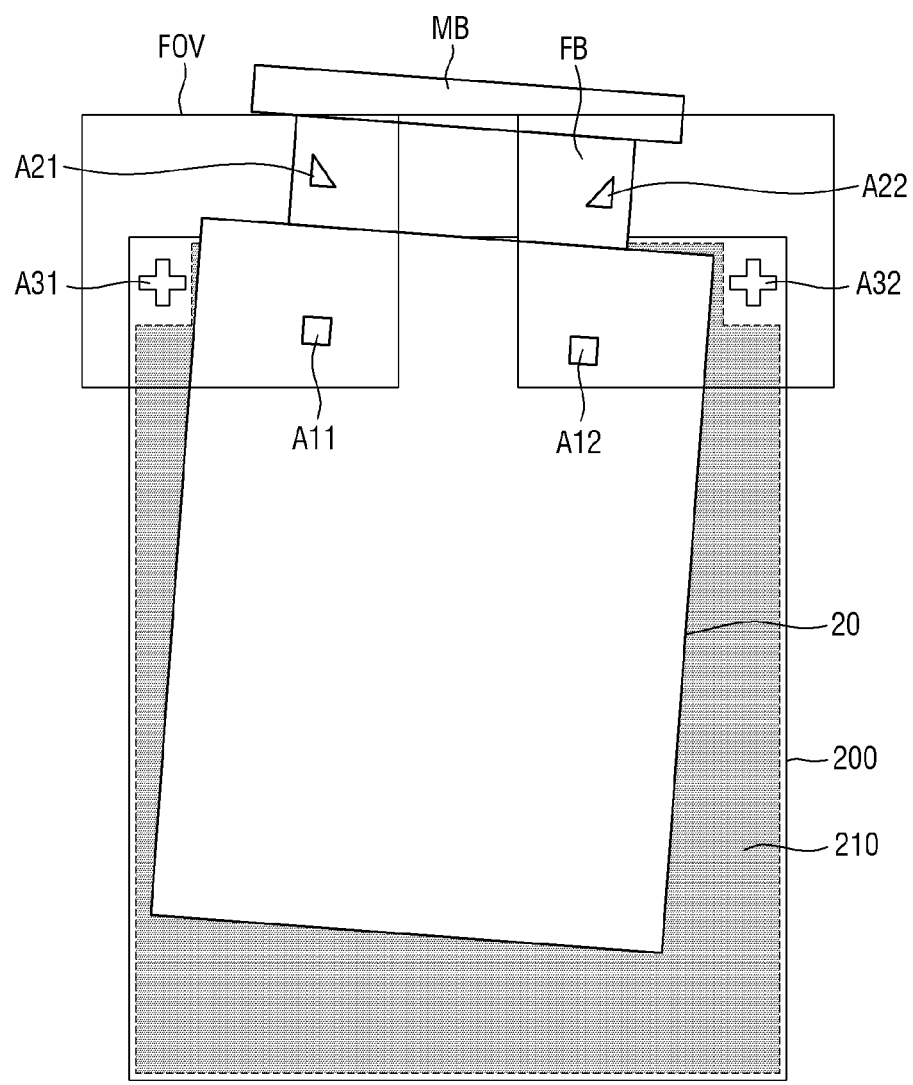
FIGS. 10 to 15 are plan views and cross-sectional views illustrating a method for of manufacturing a display device according to an embodiment.

Referring to FIG. 10, the process S1 of adsorbing the display panel 20 may include processes of providing the display device 10 and the stage 200, disposing the display panel 20 on one surface of the stage 200, and adsorbing the display panel 20 onto the stage 200.

The process of providing the display device 10 and the stage 200 may include a process of preparing the display device 10 and the stage 200, which will be bent. The display device 10 may be the same as the display device 10 described with reference to FIGS. 1 to 4, and the stage 200 may be the same as the stage 200 described with reference to FIGS. 5 to 7, but the disclosure is not limited thereto.

The display device 10 in which the panel marks are imprinted on the display panel 20 and the process marks A21 and A22 are imprinted on the first circuit board FB, and the stage 200, on which the base marks A31 and A32 are imprinted, are prepared. The panel marks A11 and A12 imprinted on the display panel 20, the process marks A21 and A22 imprinted on the first circuit board FB and the base marks A31 and A32 imprinted on the stage 200 may be imprinted using a photo process, but are not limited thereto. In an embodiment, for example, the panel marks A11 and A12 and the process marks A21 and A22 may be imprinted using a photoresist process, and the base marks A31 and A32 may be provided in a way of attaching a sticker using an adhesive. The respective marks may be imprinted two by two, and in detail, the panel marks A11 and A12 may be imprinted on the surface of the display panel 20 on a same line in the first direction X, the process marks A21 and A22 may be imprinted on the first circuit board FB on a same line in the first direction X, and the base marks A31 and A32 may be imprinted on the stage 200 on a same line in the first direction X, but not being limited thereto.

The process of disposing the display panel 20 on the one surface of the stage 200 may include a process of seating the display device 10 on the seating portion 210 of the stage 200 in a way such that a portion, to which the first circuit board FB of the display device 10 is connected, is partially disposed outside the stage 200.

The display device 10 may be disposed to be aligned with the stage 200, or may be disposed obliquely without being aligned with the stage 200 as shown in FIG. 10. However, even in a case where the display device 10 disposed obliquely with the stage 200, since the seating portion 210 is disposed in a portion other than a portion of one surface of the stage 200 on which the base marks A31 and A32 are imprinted, the display panel 20 is disposed not to overlap the base marks A31 and A32 in the third direction Z. Therefore, even after the display panel 20 is seated on the seating portion 210 of the stage 200, the position sensing unit 600 may still sense the base marks A31 and A32.

The process of adsorbing the display panel 20 onto the stage 200 may be a process in which the display panel 20 is fixed by the seating portion 210 included in the stage 200.

The seating portion 210 of the stage 200 fixes a portion of the second surface SS2 of the display device 10, in which the display device 10 and the stage 200 are disposed to overlap each other, such that the display device 10 is fixed on one surface of the stage 200. Therefore, the display device 10 is not detached from the stage 200 during the movement of the stage 200 and the bending process of the display device 10, and the relative position of the stage 200 and the display device 10 may not be changed.

Referring to FIG. 10, the process S2 of photographing the mark may include a process of sensing the position of each mark by photographing each mark imprinted on the display panel 20, the first circuit board FB and the stage 200 at an upper side of the display device 10 and the stage 200.

A photographing range of the position sensing unit 600 is defined as a field of view angle FOV. The field of view angle FOV of a pair of position sensing units 400 may have a sufficient size capable of sensing all of the panel marks A11 and A12, the process marks A21, A22 and the base marks A31 and A32. Therefore, the position sensing unit 600 may acquire position information data of all marks imprinted on the display panel 20, the first circuit board FB and the stage 200.

In an embodiment, the alignment of the display device 10 is determined using only the process marks A21 and A22 and the base marks A31 and A32 as described below, but in such an embodiment, the panel marks A11 and A12 may be still sensed because a case where the first circuit board FB is not exactly adhered to a set position of the display panel 20 may not be effectively determined as a defect if the alignment is determined by comparing only the positions of the base marks A31 and A32 and the process marks A21 and A22 without sensing the panel marks A11 and A12 at all. Therefore, in the process S2 of photographing the mark, the position of the panel marks A11 and A12 as well as the process marks A21, A22 and the base marks A31 and A32 may be sensed.

Figure 11:
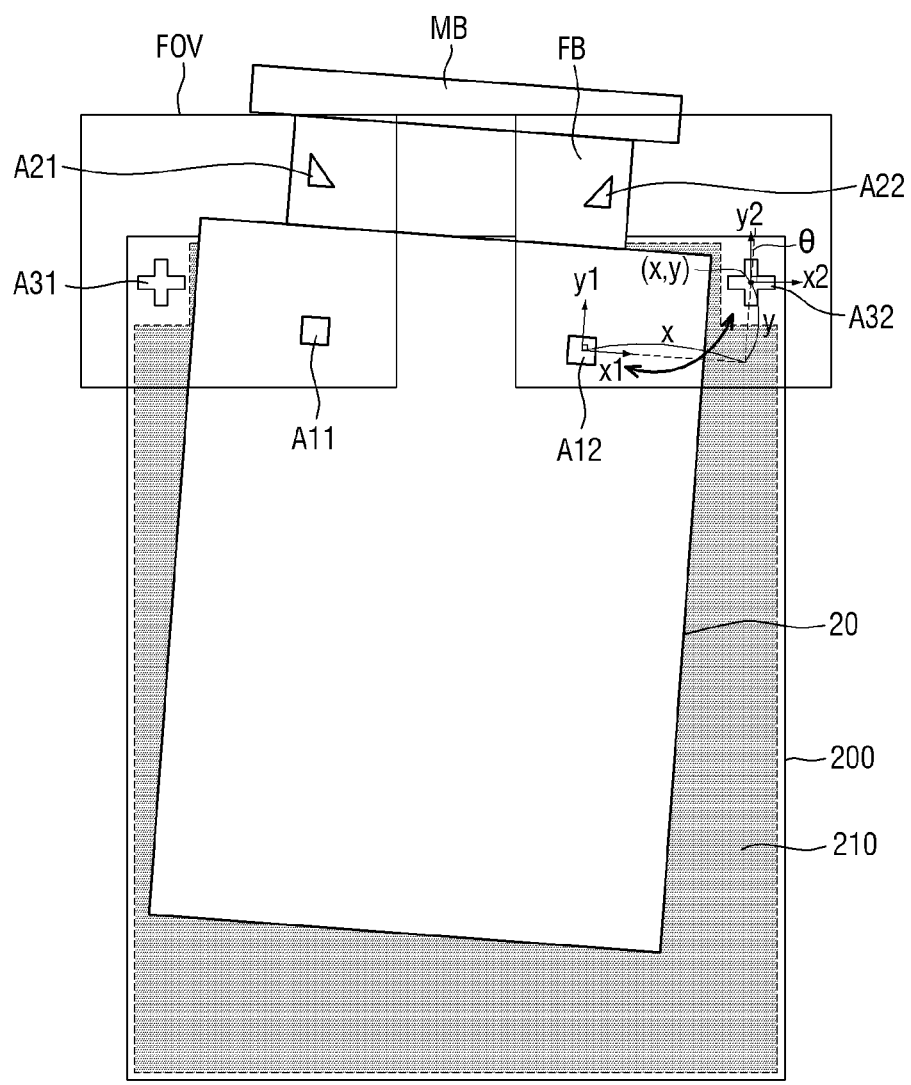

Referring to FIG. 11, the process S3 of changing the reference mark may include generating data on the relative position through the position information data and changing the reference mark from the panel marks A11 and A12 to the base marks A31 and A32.

The process of generating data on the relative position through the position information data may include determining a distance between the first panel mark A11 and the first process mark A21 in the first direction X and the second direction Y based on the first base mark A31 in the position information data and determining a distance between the second panel mark A12 and the second process mark A22 in the first direction X and the second direction Y based on the second base mark A32.

The process of changing the reference mark from the panel marks A11 and A12 to the base marks A31 and A32 may include a process of changing a reference mark for determining alignment of bending of the display device 10 from the panel marks A11 and A12 to the base marks A31 and A32. The reference mark may be changed from the panel marks A11 and A12 to the base marks A31 and A32 based on the position of each mark determined in the process of generating data on the relative position through the position information data.

In an embodiment, the process of changing the reference mark from the panel marks A11 and A12 to the base marks A31 and A32 may be performed by a first algorithm. In an embodiment, Aa separate driving unit or controller is not used for the first algorithm, and the first algorithm may be performed by the controller 500, which determines alignment of the panel by inputting an algorithm code, but is not limited thereto. In an embodiment, for example, the apparatus for manufacturing the display device 10 may include a separate controller to perform the first algorithm.

The first algorithm may include various methods of determining a position difference between of a mark after replacement and a mark prior to replacement and an angle difference between reference axes used in each mark. In an embodiment, for example, a reference coordinate system having a point, on which the panel marks A11 and A12 are imprinted, as a zero point may be set, and a relative coordinate system having a point, on which the base marks A31 and A32 are imprinted, as a zero pint may be set. Based on the reference coordinate system, a position of the zero point of the relative coordinate system is measured as a value of (x, y), and this may be defined as an offset (x, y). After an angle between x-axis and y-axis of the reference coordinate system is set to 90° and an angle between x-axis and y-axis of the relative coordinate system is set to 90°, an angle between the y-axis of the reference coordinate system and the y-axis of the relative coordinate system is measured, and the measured value may be defined as an angle difference between coordinate axes. The first algorithm may be used between one panel mark A11 or A12 and one base mark A31 or A32 to determine relative positions between the panel marks A11 and A12 and the base marks A31 and A32 and a relative position and angle of the display panel 20 and the stage 200, but the first algorithm is not limited thereto.

In an alternative embodiment, for example, the first algorithm may be performed using two panel marks A11 and A12 and two base marks A31 and A32. A reference coordinate system having a point on which the first panel mark A11 is imprinted as a zero point is set based on the first panel mark A11, and a position of the first base mark A31 is measured as a value of (x, y) based on the reference coordinate system. Each position of the second panel mark A12 and the second base mark A32 is measured as a value of (x, y) based on the reference coordinate system. A straight line connecting the zero point of the reference coordinate system with the first base mark A31 is drawn, and an angle of the straight line with x-axis of the reference coordinate system is measured. A straight line connecting the second panel mark A12 with the second base mark A32 is drawn and an angle of the straight line with x-axis of the reference coordinate system is measured. In this way, the position information and the angle information are measured using the two panel marks A11 and A12 and the two base marks A31 and A32 in one coordinate system, so that the relative positions between the panel marks A11 and A12 and the base marks A31 and A32 and the relative position and angle of the display panel 20 and the stage 200 may be identified.

In another alternative embodiment, for example, in a state that two panel marks A11 and A12 and two base marks A31 and A32 are imprinted on the display panel 20 and the stage 200, respectively, a line may be drawn from one panel mark A11 or A12 to one base mark A31 or A32 to measure displacement thereof, and a line may be drawn from the other panel mark A11 or A12 to the other base mark A31 or A32 to measure displacement thereof. Since the distance and angle between the panel marks A11 and A12 and the base marks A31 and A32 may be identified using the two displacements, the relative position of the display device 10 and the stage 200 may be identified. In this way, the first algorithm may include various methods that may replace the panel marks A11 and A12 with the base marks A31 and A32, in addition to the method described above.

In an embodiment, when the reference mark is set as the base barks A31 and A32 by changing the reference mark from the panel marks A11 and A12 to the base marks A31 and A32, even though the panel marks A11 and A12 displayed on the display panel 20 are not visible from the position sensing unit 600 as the first circuit board FB covers the display panel 20 during bending, the base marks A31 and A32 imprinted on the stage 200 may be still visible, such that alignment may be determined during bending of the display device 10. In such an embodiment, when the positions of the base marks A31 and A32 are identified, the positions of the panel marks A11 and A12 may be estimated by the first algorithm even though the panel marks A11 and A12 are not visible due to bending of the display device 10.

The process S3 of changing the reference mark may be performed by the memory 502 included in the controller 500 based on the stored lookup table. In an embodiment, the comparator 501, which receives the position data of the panel marks A11 and A12, the process marks A21 and A22 and the base marks A31 and A32 from the image analyzing unit 602, may transmit the position data of the panel marks A11 and A12 and the base marks A31 and A32 to the memory 502. The process S3 of changing the reference mark may be performed based on that the memory 502 transmits a value corresponding to the panel marks A11 and A12 and the base marks A31 and A32, which are received from the stored look-up table, to the comparator 501, but is not limited thereto.

Figure 12:
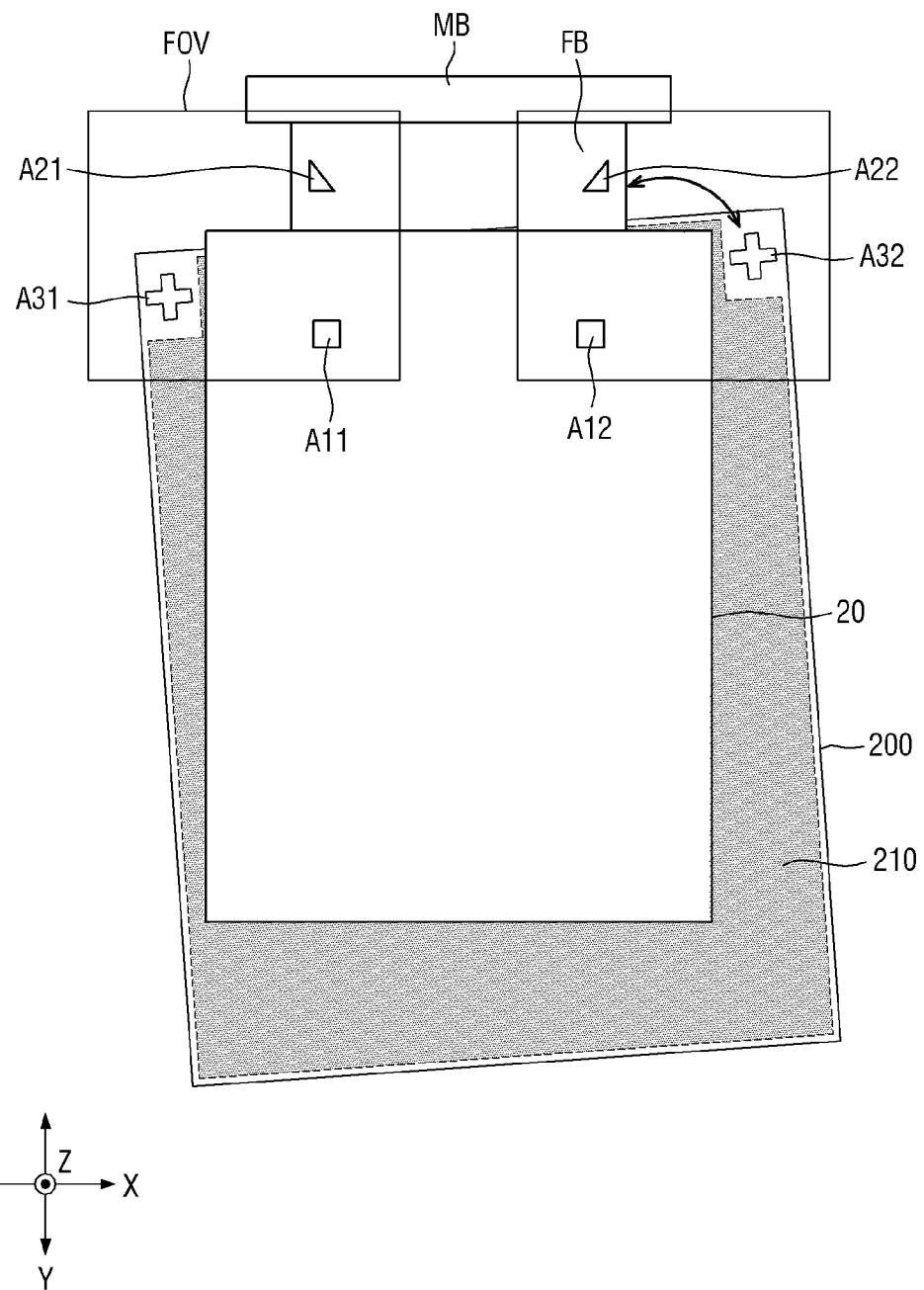

Referring to FIG. 12, the process S4 of primarily aligning the display device 10 may include adjusting the position of the stage 200 to correspond to the positions of the display device 10 and the bending unit 303 and checking whether the display panel 20 and the first circuit board FB of the display device 10 are arranged at a set position or checking an alignment state of the display panel 20 and the first circuit board FB.

The process of adjusting the position of the stage 200 to correspond to the positions of the display device 10 and the bending unit 303 may be performed using a second algorithm. The second algorithm compares the position of the display device 10 photographed by the position sensing unit 600 with a set position to match the position of the display device 10 with the set position. The position and angle of the display device 10 seated on the stage 200 may be determined using the position data of the base marks A31 and A32 and the process marks A21 and A22. When the display device 10 is obliquely seated on the stage 200, the relative position and angle of the display device 10 and the bending unit 303 may be adjusted in a way such that the arrangement of the first circuit board FB of the display device 10 corresponds to the position of the bending unit 303.

The second driving unit 302 may finely adjust the position of the bending unit 303 on the stage 200. In an embodiment, the second driving unit 302 may vary the position of the bending unit 303 on the stage 200 to at least one of the second direction Y or the first direction X, or may rotate the bending unit 303 on a plane defined by the second direction Y and the first direction X. In this way, the display panel 20 may primarily be aligned by adjusting the position of the bending unit 303 or rotating the bending unit 303, such that the relative position and angle of the display device 10 and the bending unit 303 may be adjusted.

The process S4 of primarily aligning the display device 10 may be performed by allowing the comparator 501 to drive the second driving unit 302 by receiving data from the memory 502. In an embodiment, the memory 502 may transmit, from the stored lookup table to the comparator 501, the position data of the ideal process marks A21 and A22 and the position data of the ideal base marks A31 and A32 before bending, which correspond to the position data of the panel marks A11 and A12 and the base marks A31 and A32, which are received from the comparator 501. The comparator 501 may receive the position data of the ideal process marks A21 and A22 and the position data of the ideal base marks A31 and A32 from the memory 502, compare the received position data with the position data of the sensed process marks A21 and A22 and the position data of the base marks A31 and A32 and then drive the second driving unit 302 to match the position data of the sensed process marks A21 and A22 and the position data of the base marks A31 and A32 with the position data of the ideal process marks A21 and A22 and the position data of the ideal base marks A31 and A32.

Figure 13:
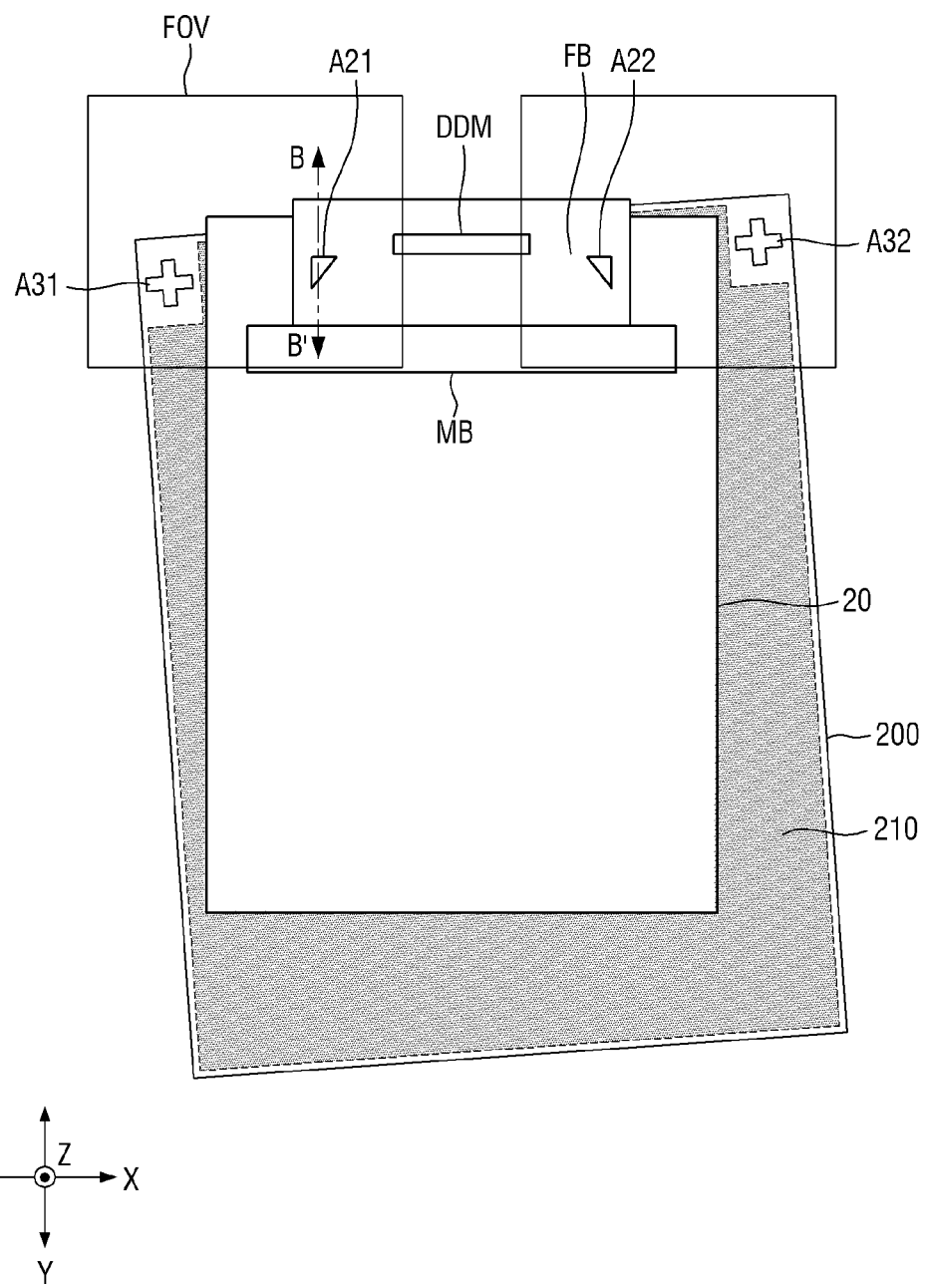
Figure 14:
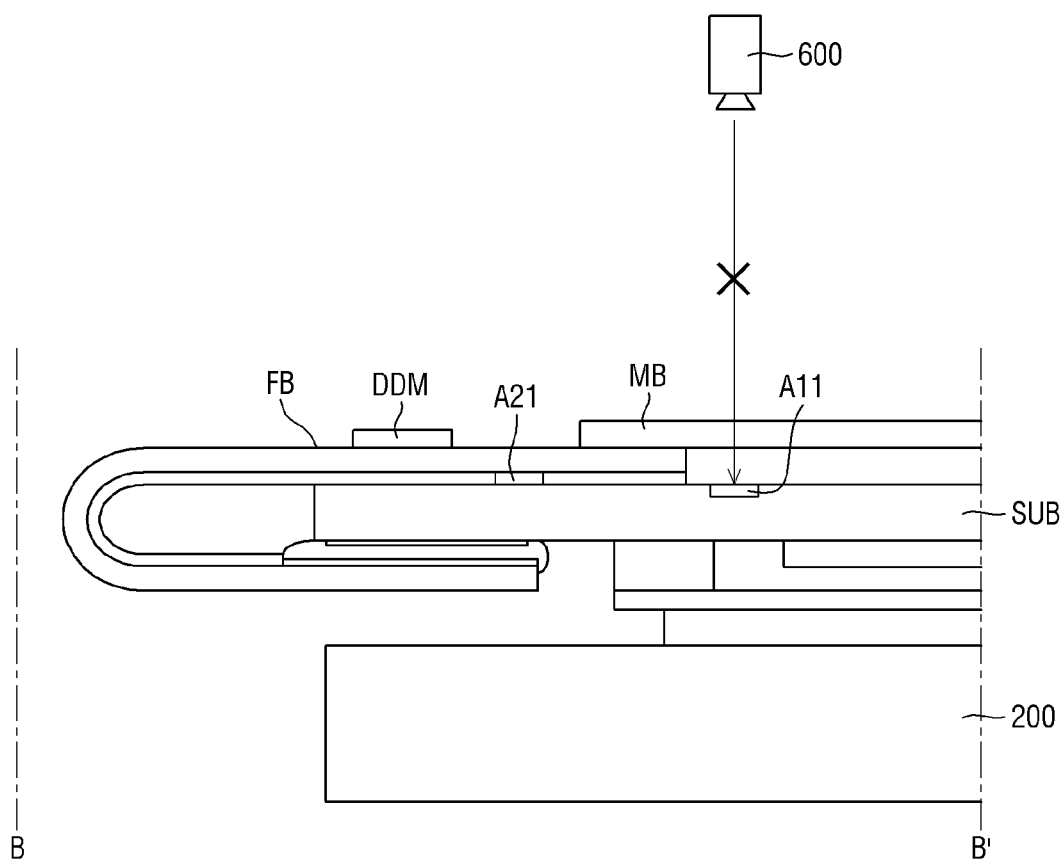

Referring to FIGS. 13 and 14, the process S5 of bending the display device 10 may be a process of bending the first circuit board FB by using the apparatus for manufacturing the display device 10.

When the alignment of the display device 10 is completed, the stage 200 or the bending unit 303 may move in a way such that the bending unit 303 may be disposed on a lower surface of the bending unit 303 of the stage 200. The bending unit 303 may be disposed to face the second surface BSF_NCS of the display device 10. The bending unit 303 moves in the third direction Z and then is attached to the second surface BSF_NCS of the display device 10, and the bending unit 303 may bend the display device 10 along a preset bending path. A bending path in which the display device 10 is bent may be previously set. In an embodiment, for example, the bending path of the display device 10 may be set in consideration of a type of a member, a position of the member, stress applied to the display device 10 during bending, etc.

When the bending unit 303 moves along the bending path, the first circuit board FB of the display device 10 may be bent. The second surface BSF_NCS of the first circuit board FB may be bent in a way such that the first circuit board FB may move from a lower side to an upper side. The first surface BSF_CS of the first circuit board FB may be in contact with a portion of the other surface of the display panel 20. When the display device 10 is bent, the positions of the panel marks A11 and A12 and the base marks A31 and A32 are not changed, but the position of the process marks A21 and A22 may be changed.

As shown in FIG. 14, the panel marks A11 and A12 and the first circuit board FB that is bent may be disposed to overlap each other in the third direction Z. Therefore, the first circuit board FB may be disposed between the position sensing unit 600 disposed above the display panel 20 and the panel marks A11 and A12, such that the panel marks A11 and A12 may not be sensed by the field of view angle of the position sensing unit 600.

In some embodiments, the panel marks A11 and A12 may not be completely covered by the first circuit board FB by the arrangement or transparency of the first circuit board FB, such that the position sensing unit 600 may sense all or some of the panel marks A11 and A12, and the position of the panel marks A11 and A12 may overlap the position of the process marks A21 and A22. In such embodiments, the position sensing unit 600 may extract a portion of the process marks A21 and A22 from the marks sensed in one shape as the panel marks A11 and A12 overlap the process marks A21 and A22. In an embodiment, for example, after information on the process marks A21 and A22 is previously stored in a state that the first circuit board FB is bent, the position of the process marks A21 and A22 may be sensed using a method of extracting the same shape as the stored shape from the sensed screen.

In embodiments described above, the display device 10 of FIGS. 1 to 4 is bent using the apparatus for manufacturing the display device 10 of FIGS. 5 to 7, but it is not limited thereto and various display devices 10 may be bent using the apparatus for manufacturing the various display devices 10 known in the art. In an embodiment, for example, where the display device 10 is a flexible display device, the display panel 20 as well as the first circuit board FB may be bent.

Figure 15:
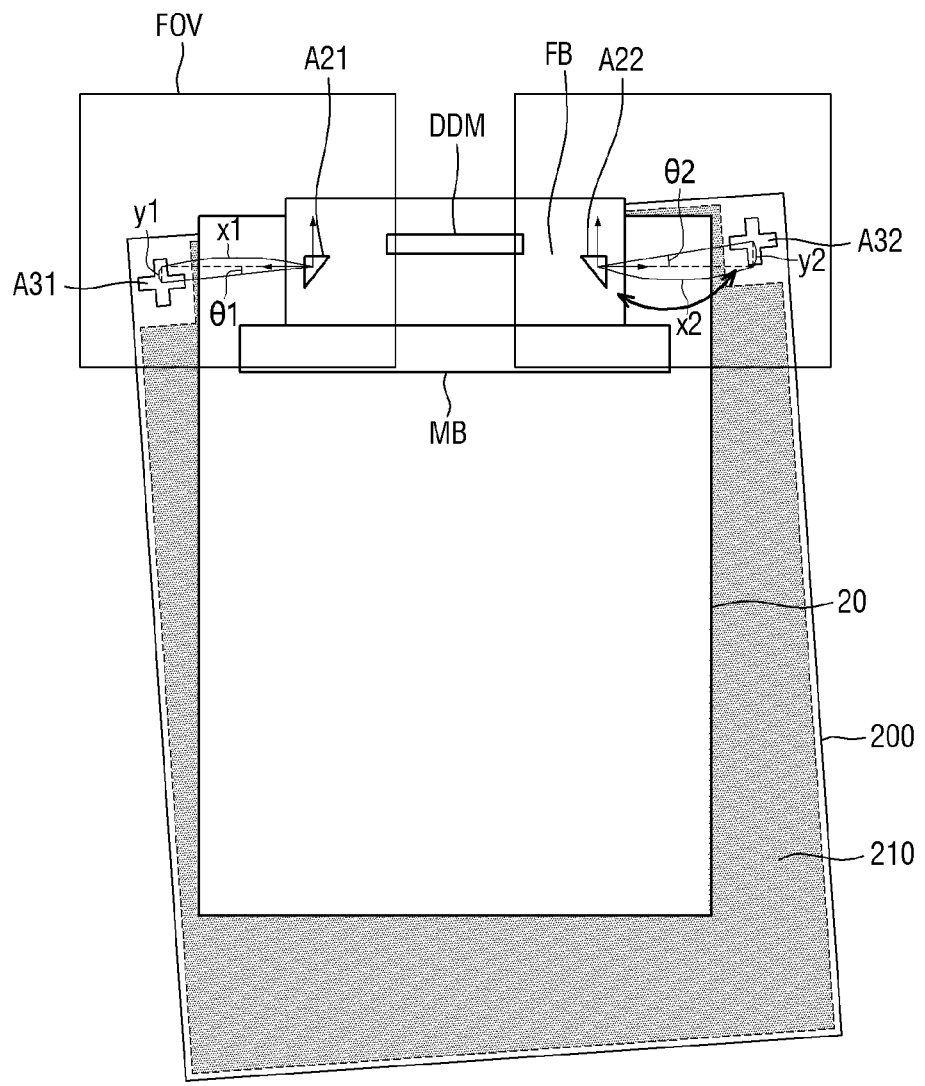

Referring to FIG. 15, the process of secondarily aligning the display device 10 may be performed by a third algorithm. The third algorithm may include determining whether the positions of the base marks A31 and A32 and the process marks A21 and A22 are the same as a set position and adjusting the first circuit board FB in a way such that the base marks A31 and A32 and the process marks A21 and A22 are disposed at the set position.

In an embodiment, as described above in FIG. 11, the reference mark may be changed from the panel marks A11 and A12 to the base marks A31 and A32 to perform the third algorithm regardless of whether the panel marks A11 and A12 are visible.

The process of determining whether the base marks A31 and A32 and the process marks A21 and A22 are the same as the set position may include a process of calculating a distance between the base marks A31 and A32 and the process marks A21 and A22 in the first direction X based on the position of the marks sensed by the position sensing unit 600 and determining whether the distance between the base marks A31 and A32 and the process marks A21 and A22 is the same as a predetermined distance value. The base marks A31 and A32 may be compared with the process marks A21 and A22 to determine the alignment of the display panel 20 and the first circuit board FB that is bent.

In detail, a difference value x1 between the first base mark A31 and the first process mark A21 in the first direction X may be calculated. Also, a difference value x2 between the second base mark A32 and the second process mark A22 in the first direction X may be calculated. A distance (Dx) between the base marks A31 and A32 and the process marks A21 and A22 in the first direction X in the display device 10 that is bent may be calculated by the following Equation 1.

$$Dx=(x1+x2)/2 \qquad \text{[Equation 1]}$$

A distance between the base marks A31 and A32 and the process marks A21 and A22 in the second direction Y may be calculated based on the image photographed by the position sensing unit 600. In detail, a difference value y1 between the first base mark A31 and the first process mark A21 in the second direction Y may be calculated. Also, a difference value y2 between the second base mark A32 and the second process mark A22 in the second direction Y may be calculated. A distance (Dy) between the base marks A31 and A32 and the process marks A21 and A22 in the second direction Y in the display device 10 that is bent may be calculated by the following Equation 2.

$$Dy=(y1+y2)/2 \qquad \text{[Equation 2]}$$

When the values of X and Y of the display device 10 are completely calculated, a rotational angle θ that serves to check how long a final position of the display device 10 has been rotated from a preset position. In an embodiment, for example, an angle θ1 between a line segment connecting the first base mark A31 with the first process mark A21 of FIG. 15 and a line segment (or reference line) passing through the first process mark A21 while being parallel with the first direction X is calculated. In such an embodiment, an angle θ2 between a line segment connecting the second base mark A32 with the second process mark A22 and a line segment passing through the second process mark A22 while being parallel with the second direction Y is calculated. The rotational angle (θ) may be calculated by the following Equation 3.

$$θ=(θ1+θ2)/2 \qquad \text{[Equation 3]}$$

θ1 and θ2 may have a negative value when measured in a direction rotating in one direction based on a reference line, and may have a positive value when measured in a direction opposite to one direction.

In consideration of sizes of the display panel 20, the first circuit board FB and the stage 200 and the position where each mark is imprinted, the setting values of X, Y and θ may be set to be compared with the values of X, Y and θ calculated as described above. In an embodiment, for example, the setting values may be set such that X is 200 mm, Y is 200 mm and θ is 10°. It is determined whether the values of X, Y and θ calculated by the above equations are equal to the setting values.

In an alternative embodiment, for example, the process of determining whether the base marks A31 and A32 and the process marks A21 and A22 are the same as the set positions may be a process of determining whether each mark photographed by setting a specific position is different from a set position. The position of each set mark may be the position of the marks when the display device 10 has been exactly bent. A distance between the preset position of each of the marks and the positions photographed by the position sensing unit 600 may be measured, and a total sum thereof may be obtained. Then, when the total sum is not 0, it may be determined that the final position of the bent display device 10 is different from the preset position.

In an embodiment, as described above, the base marks A31 and A32 and the process marks A21 and A22 may be compared with each other, but the disclosure is not limited thereto. In an alternative embodiment, for example, the third algorithm may be performed by determining the relative positions of the base marks A31 and A32 and the process marks A21 and A22, estimating the position of the panel marks A11 and A12 with the base marks A31 and A32, converting the relative positions of the base marks A31 and A32 and the process marks A21 and A22 into the relative positions between the panel marks A11 and A12 and the process marks A21 and A22 and comparing the relative positions between the panel marks A11 and A12 and the process marks A21 and A22 with relative positions between the preset panel marks A11 and A12 and the base marks A21 and A32. In such an embodiment, whether the display device 10 is aligned after bending may be determined using the same preset value regardless of the relative arrangement of the stage 200 and the display panel 20.

The process of adjusting the first circuit board FB in a way such that the base marks A31 and A32 and the process marks A21 and A22 are disposed at a set position may include a process of adjusting the position of the first circuit board FB in a way such that the values of X, Y and θ are substantially equal to the set value by finely adjusting the bending unit 303 attached to the first circuit board FB.

The process of secondarily aligning the display device 10 may be performed by allowing the comparator 501 to drive the bending unit 303 by receiving data from the memory 502. In an embodiment, when the photographing unit 601 photographs an image of the bent display device 10 and transmits the photographed image to the image analyzing unit 602, the image analyzing unit 602 may extract position data of the process marks A21 and A22 and the base marks A31 and A32 from the photographed image. The image analyzing unit 602 may transmit the extracted position data of the process marks A21 and A22 and the base marks A31 and A32 to the comparator 501. When the comparator 501 transmits the received position data of the process marks A21 and A22 and the base marks A31 and A32 to the memory 502, the memory 502 may transmit the position data of the ideal process marks A21 and A22 and the position data of the ideal base marks A31 and A32, which correspond to the data received from the stored lookup table, to the comparator 501. The comparator 501 may compare the position data of the sensed process marks A21 and A22 and the position data of the base marks A31 and A32 with the position data of the ideal process marks A21 and A22 and the position data of the base marks A31 and A32. The comparator 501 may drive the bending unit 303 in a way such that the position data of the sensed process marks A21 and A22 and the position data of the base marks A31 and A32 may be matched with the position data of the ideal process marks A21 and A22 and the position data of the base marks A31 and A32.

Referring to FIG. 15, the process of determining whether an error criterion is satisfied may be a process of determining whether a difference and/or ratio between the calculated values of X, Y and θ and the set value satisfies (or is within) an error range.

The process of determining whether the error range is satisfied (or determining a bending state of the display device 10) may include determining whether the error range is satisfied when the difference between the values of X, Y and θ calculated through the equations and the set values is less than or equal to a specific value and determining that the error range is not satisfied when the difference is greater than or equal to the specific value. In an embodiment, for example, as described above, the set values may be set such that X is 200.0 mm, Y is 200.0 mm and θ is 10.0° and the values calculated through the equations may be set such that X is 200.1 mm, Y is 199.8 mm and θ is 9.9°. In such an embodiment, the error range may be set such that a difference in the value of X and the value of Y is within 1 mm and a difference in the value of θ is within 1°. In such an embodiment, since the difference in the value of X is 0.1 mm, the difference in the value of Y is 0.2 mm and the difference in the value of θ is 0.1° to satisfy the set error range, it may be determined that the error range is satisfied.

In an embodiment, as described above, it may be determined whether the error range is satisfied using the difference between the calculated value and the set value, the method of determining whether the error range is satisfied is not limited thereto. In an embodiment, for example, when a value obtained by dividing the values of X, Y and θ calculated by the equations by each corresponding set value is satisfied within a specific numerical range, it may be determined that the error range is satisfied, and when the value is not satisfied within a specific numerical range, it may be determined that the error range is not satisfied.

In an embodiment, since the error range may vary depending on the size, type and purpose of use of each display device 10, an error range smaller than that in the embodiment described above may be obtained. In such an embodiment, instead of all of the values of X, Y and θ, only the values of X and Y may be used as the set values and compared with the values calculated through the Equations 1 and 2 to determine whether the error range is satisfied.

When the error range is satisfied, the bending unit 303 may pressurize the first circuit board FB toward the other surface of the display panel 20 to attach the first circuit board FB to the other surface of the display panel 20 by using an adhesive attached to the end of the first circuit board FB. When the error range is not satisfied, the process of secondarily aligning the display device 10 may be performed to perform realignment.

The process of determining whether the error range is satisfied may be performed by allowing the comparator 501 to compare the position data of the process marks A21 and A22 and the position data of the base marks A31 and A32 with the position data of the ideal process marks A21 and A22 and the position data of the ideal base marks A31 and A32 and determine whether a difference between their positions satisfies the error range. When the error range is not satisfied, the comparator 501 may drive the bending unit 303 to perform secondary alignment.

In an embodiment, as described above, as the reference mark is changed from the panel marks A11 and A12 to the base marks A31 and A32, even in a case where interference of the reference mark occurs in the bending process of the display device 10, the display panel 20 may be prevented from being determined as impossible process or a defect in the process of re-checking the reference mark. That is, as the reference mark is replaced from the panel marks A11 and A1 imprinted on the display panel 20 to the base marks A31 and A32 imprinted on the stage 200, the position of the reference mark and the bending position of the display device 10 may be the same as each other, such that checking of the reference mark may be prevented from being precluded. Therefore, in a case where mark interference occurs in the reference mark, a panel defect may be determined to prevent the display panel 20 from being discarded, such that process efficiency of the display device 10 may be increased.

In an embodiment, as described above, the method of determining alignment of the display device 10 may include replacing the panel marks A11 and A12 imprinted on the display panel 20 with the base marks A31 and A32 imprinted on the stage 200 during the bending process of the display device 10, but it is not limited to the bending process of the display device 10. In an embodiment, for example, the panel marks A11 and A12 imprinted on the display panel 20 may be replaced with the base marks A31 and A32 imprinted on the display panel 20 even in case of a chip on glass ("COG") method in which the display device 10 is not bent, such that the alignment of the display device 10 may be determined. It will be apparent that the method of replacing the panel marks A11 and A12 with the base marks A31 and A32 may be applied to various processes related to the alignment of the display device 10.

Figure 16:
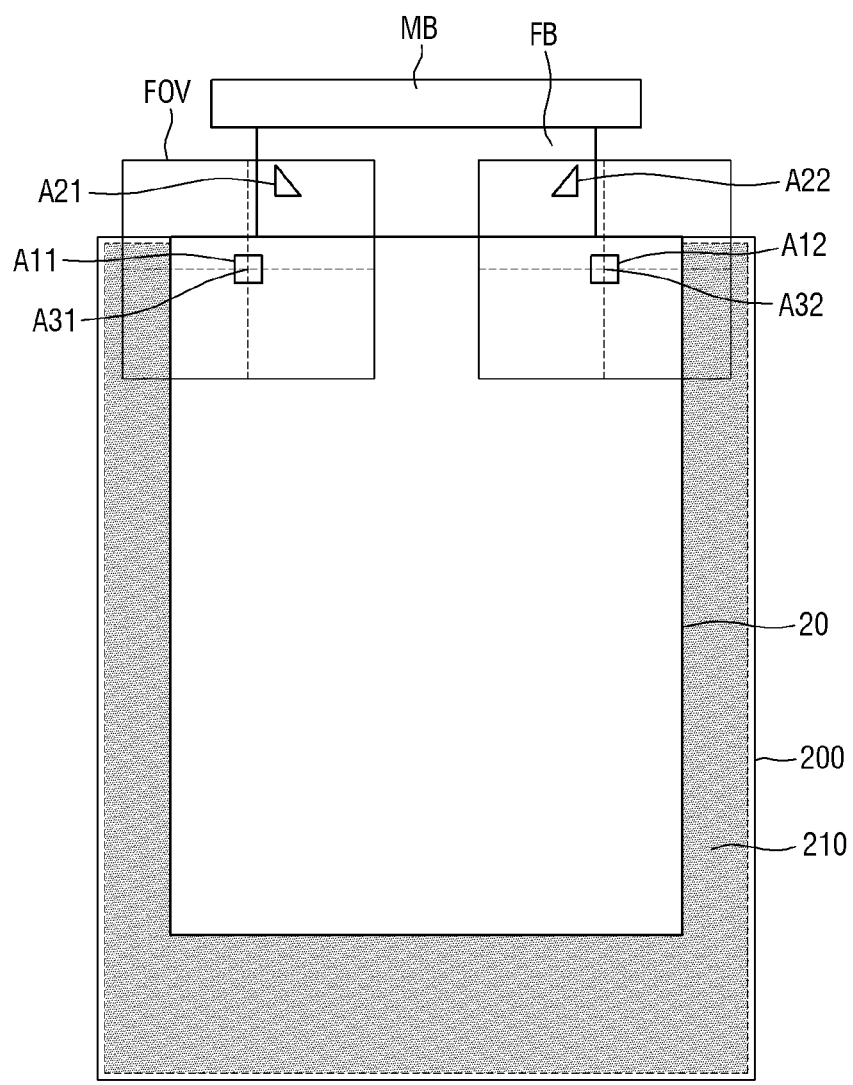
FIG. 16 is a plan view illustrating schematic positions of panel marks, base marks and process marks according to an alternative embodiment.

FIG. 16 is a plan view illustrating schematic positions of panel marks, base marks and process marks according to an alternative embodiment.

The embodiment of a method of determining alignment during bending of the display device 10 shown in FIG. 16 is substantially the same as the embodiment described above with reference to FIG. 7 except that the base marks A31 and A32 are not separately imprinted on the stage 200 and an entire portion of one surface of the stage 200 is the seating portion 210.

Referring to FIG. 16, the process S2 of photographing the mark of FIG. 9 may include a process of allowing the position sensing unit 600 to photograph the display device 10 and the stage 200 above the display device 10 and the stage 200. The panel marks A11 and A12 imprinted on the display panel 20 and the process marks A21 and A22 imprinted on the first circuit board FB may be imprinted using a photo process, but are not limited thereto.

The marks may be imprinted two by two. In an embodiment, the panel marks A11 and A12 may be imprinted on the surface of the display panel 20 on a same line in the first direction X, the process marks A21 and A22 may be imprinted on the first circuit board FB on a same line in the first direction X, and the base marks A31 and A32 may be imprinted on the stage 200 on a same line in the first direction X, but the relative positions and numbers of the marks are not limited thereto.

In the bending process of the display panel 20, the position sensing unit 600 for photographing the display device 10 and the stage 200 may be disposed on the stage 200, and a specific point within a field of view angle FOV, which is sensed by the position sensing unit 600, may be defined as the base marks A31 and A32. The specific point within the field of view angle FOV, which is sensed by the position sensing unit 600, may be the same point as the panel marks A11 and A12 imprinted on the display panel 20, and in this case, the panel marks A11 and A12 and the base marks A31 and A32 may be defined as the same point. In the bending process of the display device 10, the panel marks A11 and A12 may not be visible to the position sensing unit 600 due to the first circuit board FB, and the base marks A31 and A32 defined as the specific point within the field of view angle FOV, which is sensed by the position sensing unit 600, may still be fixed so that the position of the base marks A31 and A32 may be checked regardless of bending. As a result, it may be determined whether the display device 10 is aligned, by using the fixed base marks A31 and A32 even without additional imprinting on the stage 200. Therefore, the arrangement of the display device 10 may be determined, as shown and described in FIGS. 9 and 10 to 15, by using the base marks A31 and A32 defined as the specific point within the field of view angle FOV, which is sensed by the position sensing unit 600, the panel marks A11 and A12 and the process marks A21 and A22, during bending of the display device 10.

In such an embodiment, the apparatus for manufacturing the display device 10 is substantially the same as that of the embodiment of FIG. 7 except that the stage 200 does not include the base marks A31 and A32 and the position sensing unit 600 sets a specific point within a photographing range of the photographing unit 601 to the base marks A31 and A32. The specific point set to the base marks A31 and A32 may be the same point as the point at which the panel marks A11 and A12 are positioned in the image photographed by the photographing unit 601.

Figure 17:
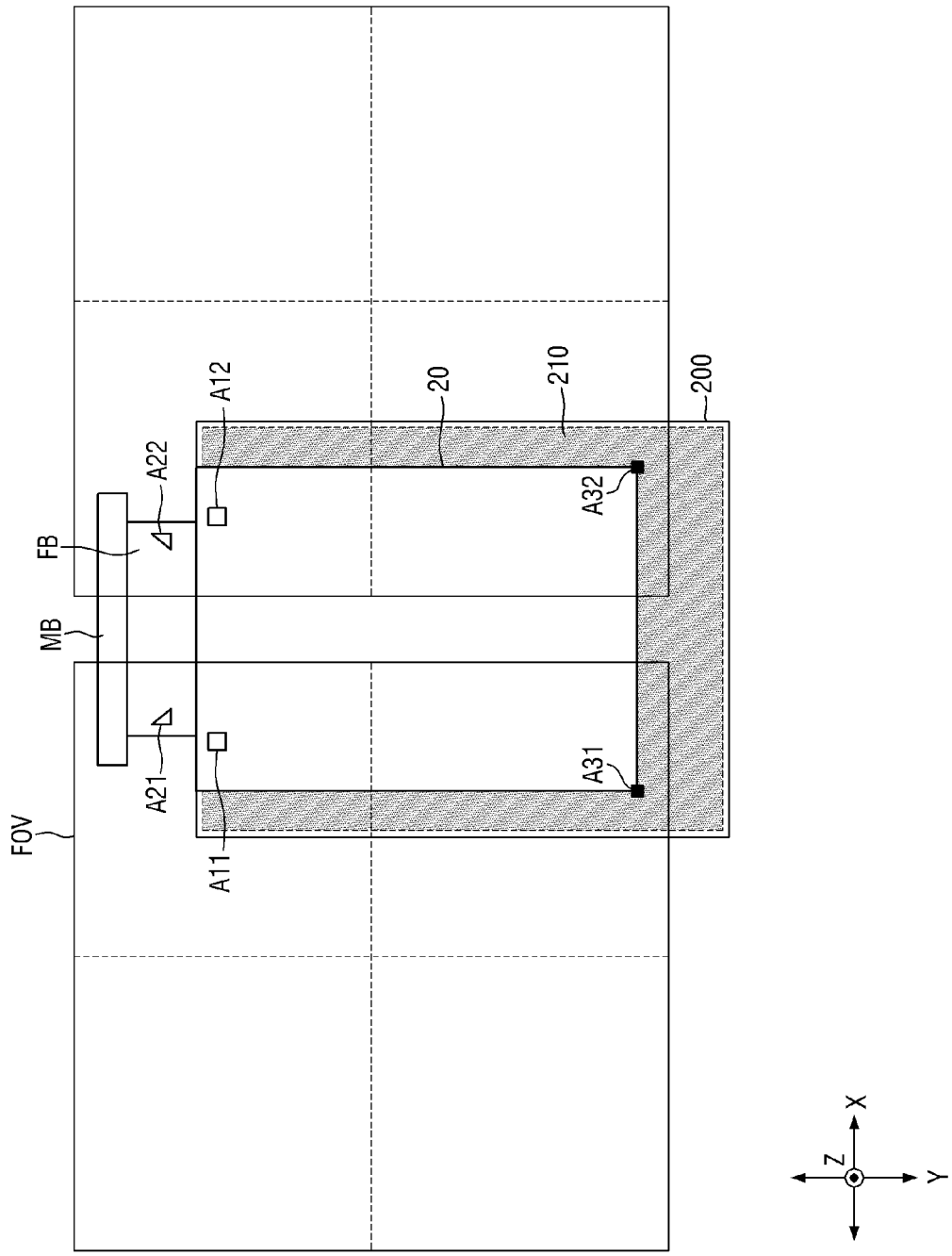
FIG. 17 is a plan view illustrating schematic positions of panel marks, base marks and process marks according to another alternative embodiment.

FIG. 17 is a plan view illustrating schematic positions of panel marks, base marks and process marks according to another alternative embodiment.

The embodiment of the method of determining alignment during bending of the display device 10 shown in FIG. 17 is substantially the same as the embodiment of FIG. 7 except that the position sensing unit 600 capable of supporting all edges of the other surface of the display panel 20 within the field of view angle is used.

Referring to FIG. 17, the process S2 of photographing the mark of FIG. 9 may include a process of allowing the position sensing unit 600 to photograph the display device 10 and the stage 200 above the display device 10 and the stage 200. The panel marks A11 and A12 imprinted on the display panel 20 and the process marks A21 and A22 imprinted on the first circuit board FB may be imprinted using a photo process, but are not limited thereto.

The marks may be imprinted two by two. In an embodiment, the panel marks A11 and A12 may be imprinted on the surface of the display panel 20 on a same line in the first direction X, the process marks A21 and A22 may be imprinted on the first circuit board FB on a same line in the first direction X, and the base marks A31 and A32 may be imprinted on the stage 200 on a same line in the first direction X, but are not limited thereto.

In such an embodiment, the apparatus for manufacturing the display device 10 used for the bending process of the display device 10 includes a position sensing unit 600 that photographs the display device 10 and the stage 200 above the stage 200. The distance between the position sensing unit 600 and the stage 200 may be adjusted or a camera having a wide field of view angle FOV may be as the position sensing unit 600, such that the position sensing unit 600 capable of supporting all edges of the other surface of the display panel 20 within the field of view angle may be used.

The specific point within the field of view angle FOV, which is sensed by the position sensing unit 600, may be defined as the base marks A31 and A32. The edge on the other surface of the display panel 20 within the field of view angle FOV, which is sensed by the position sensing unit 600, may be defined as the base marks A31 and A32. In the bending process of the display device 10, the panel marks A11 and A12 may not be visible to the position sensing unit 600 due to the first circuit board FB, and since the first circuit board FB is not bent to a corner portion positioned in an opposite direction of the display device 10, the position of the base marks A31 and A32 may be checked regardless of the bending of the display device 10. Therefore, the fixed base marks A31 and A32 may be defined even without additional imprinting on the stage 200. The arrangement of the display device 10 may be determined, as shown and described in FIGS. 9 and 10 to 15, by using the base marks A31 and A32 defined as above, the panel marks A11 and A12 and the process marks A21 and A22, during bending of the display device 10.

In such an embodiment, the apparatus for manufacturing the display device 10 according to the embodiment is substantially the same as that of the embodiment of FIG. 7 except that the position sensing unit 600 may support all edges of a target disposed on the stage 200 and specific points set to the base marks A1 and A32 by the position sensing unit 600 are two vertexes of the target disposed on the stage 200.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method for manufacturing a display device, the method comprising:
preparing a display device comprising a display panel including a first alignment mark and a first circuit board including a second alignment mark and on one end of the display panel, wherein the first alignment mark overlaps the first circuit board in a thickness direction of the display device when the display device is bent;
disposing the display device on a stage including a base mark;
setting the base mark as a reference mark in consideration of a relative position relation between the first alignment mark and the base mark by sensing the first alignment mark and the base mark; and
determining a bending state of the display device by sensing the base mark and the second alignment mark and identifying a position relation between the base mark and the second alignment mark.

2. The method of claim 1, wherein the preparing the display device includes:
disposing the first circuit board including the second alignment mark on the one end of the display panel including the first alignment mark;
determining an alignment state of the first circuit board and the display panel by identifying the position relation of the first alignment mark and the second alignment mark; and
attaching the first circuit board to the one end of the display panel.

3. The method of claim 2, wherein the determining the bending state of the display device includes primarily aligning the display device by adjusting a relative position and angle of the display device and a bending unit by using position data of the base mark and the second alignment mark before bending of the display device.

4. The method of claim 3, wherein the determining the bending state of the display device includes performing the bending of the display device by allowing the bending unit to bend the first circuit board.

5. The method of claim 4, wherein the determining the bending state of the display device further includes secondarily aligning the display device by adjusting a relative position of the display panel and the first circuit board which is bent, by using position data of the base mark and the second alignment mark after the bending of the display device.

6. The method of claim 5, wherein the determining the bending state of the display device further includes determining whether a difference between the position data of the base mark and the second alignment mark and set data is less than or equal to a reference value by comparing the position data of the base mark and the second alignment mark with the set data after the bending of the display device.

7. The method of claim 4, wherein the determining the bending state of the display device further includes allowing the banding unit to pressurize the first circuit board an end of which an adhesive is disposed on, toward the display panel to attach a surface of the one end of the display panel to the first circuit board.

* * * * *